United States Patent
Kiyama et al.

(10) Patent No.: US 12,416,097 B2
(45) Date of Patent: Sep. 16, 2025

(54) GALLIUM ARSENIDE SINGLE CRYSTAL SUBSTRATE AND METHOD OF MANUFACTURING SAME

(71) Applicant: SUMITOMO ELECTRIC INDUSTRIES, LTD., Osaka (JP)

(72) Inventors: Makoto Kiyama, Osaka (JP); Yoshihiro Saito, Osaka (JP); Yutaka Hoshina, Osaka (JP); Yojiro Nakayama, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/683,517

(22) PCT Filed: Sep. 16, 2022

(86) PCT No.: PCT/JP2022/034768
§ 371 (c)(1),
(2) Date: Feb. 14, 2024

(87) PCT Pub. No.: WO2024/057533
PCT Pub. Date: Mar. 21, 2024

(65) Prior Publication Data
US 2024/0426023 A1    Dec. 26, 2024

(51) Int. Cl.
| | |
|---|---|
| *B32B 3/26* | (2006.01) |
| *C30B 29/42* | (2006.01) |
| *C30B 33/00* | (2006.01) |
| *H01L 21/02* | (2006.01) |
| *H10D 62/85* | (2025.01) |

(52) U.S. Cl.
CPC ............ *C30B 29/42* (2013.01); *B32B 3/26* (2013.01); *C30B 33/00* (2013.01); *H01L 21/02052* (2013.01); *H10D 62/85* (2025.01)

(58) Field of Classification Search
CPC ..... B32B 3/26; H01L 21/02052; C30B 29/42; C30B 33/00
See application file for complete search history.

(56) References Cited

U.S. PATENT DOCUMENTS

2020/0052075 A1    2/2020    Fujiwara et al.

FOREIGN PATENT DOCUMENTS

| | | |
|---|---|---|
| JP | 6-45318 A | 2/1994 |
| JP | H07-165499 A | 6/1995 |
| JP | 10-12577 A | 1/1998 |
| JP | 11-278979 A | 10/1999 |
| JP | 2006-352075 A | 12/2006 |

(Continued)

OTHER PUBLICATIONS

CN110114518 (Year: 2019).*

*Primary Examiner* — Elizabeth E Mulvaney
(74) *Attorney, Agent, or Firm* — Renner, Otto, Boisselle & Sklar, LLP

(57) ABSTRACT

A gallium arsenide single crystal substrate includes a main surface having a circular shape and has a first integrated intensity ratio or a second integrated intensity ratio. The first integrated intensity ratio and the second integrated intensity ratio are obtained from a spectrum, based on a predetermined X-ray photoelectron spectroscopy, of each of arsenic and gallium. The number of particles each having a major axis of 0.16 μm or more is 2 or less per cm² of the main surface.

10 Claims, 8 Drawing Sheets

(56) References Cited

FOREIGN PATENT DOCUMENTS

| | | |
|---|---|---|
| JP | 2008-300747 A | 12/2008 |
| JP | 2016-519033 A | 6/2016 |
| JP | 2021-15999 A | 2/2021 |
| WO | 2014/124980 A2 | 8/2014 |
| WO | 2018/216440 A1 | 11/2018 |

* cited by examiner

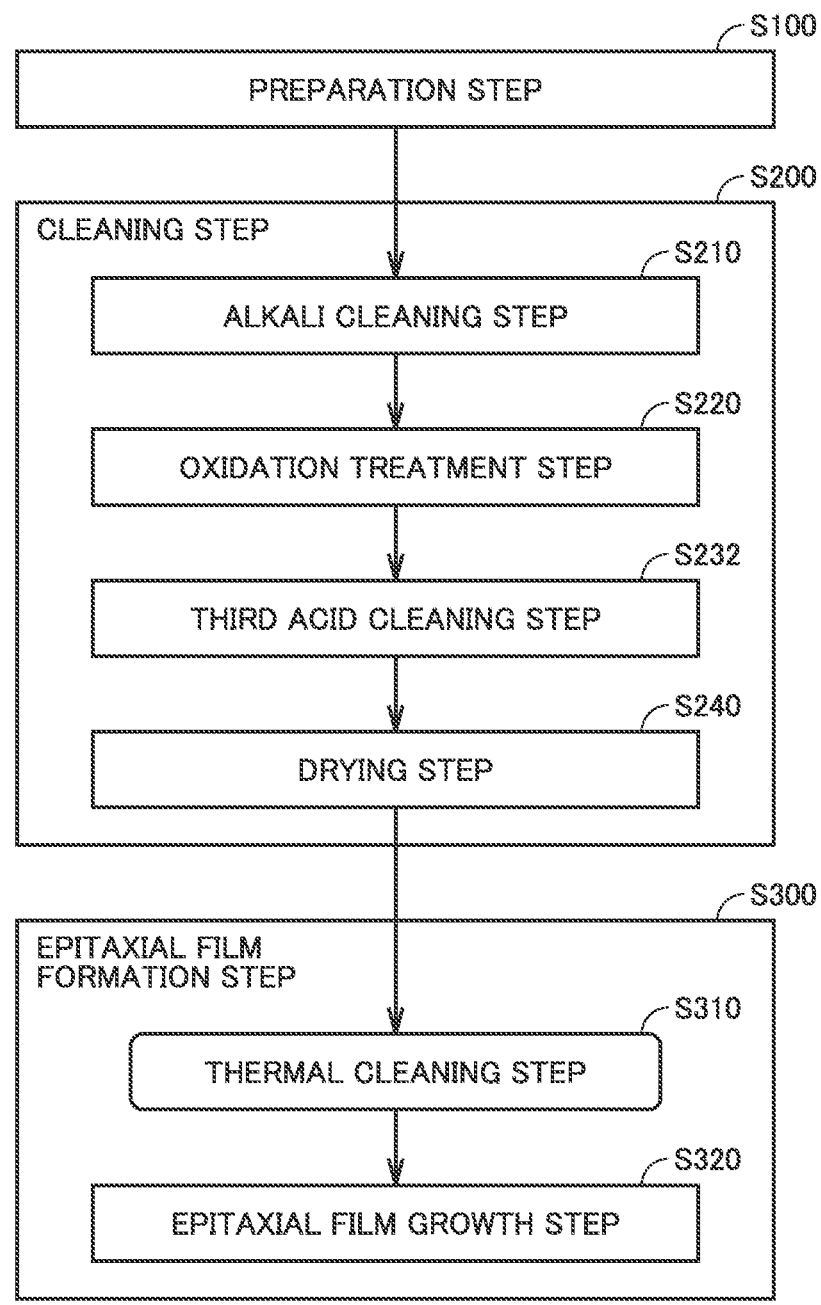

GALLIUM ARSENIDE SINGLE CRYSTAL SUBSTRATE AND METHOD OF MANUFACTURING SAME

TECHNICAL FIELD

The present disclosure relates to a gallium arsenide single crystal substrate and a method of manufacturing the same.

BACKGROUND ART

In a process of manufacturing an electronic device, it is known that thermal cleaning is performed in an epitaxial growth furnace to remove an oxide film formed on a surface of a gallium arsenide single crystal substrate (hereinafter also referred to as "GaAs single crystal substrate") before an epitaxial layer is grown on the substrate. Japanese Unexamined Patent Application Publication No. H07-165499 (PTL 1) discloses a method of manufacturing a GaAs single crystal substrate having a crystal surface from which gallium oxides in the oxide film can be easily removed by the thermal cleaning. WO 2014/124980 (PTL 2) teaches that the oxide film can be advantageously removed by the thermal cleaning when the oxide film is homogenized using a predetermined treatment method.

CITATION LIST

Patent Literature

PTL 1: Japanese Unexamined Patent Application Publication No. H07-165499
PTL 2: WO 2014/124980

SUMMARY OF INVENTION

A gallium arsenide single crystal substrate according to the present disclosure includes a main surface having a circular shape. The gallium arsenide single crystal substrate has a first integrated intensity ratio or a second integrated intensity ratio. The first integrated intensity ratio and the second integrated intensity ratio are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under a condition of an incident X-ray energy of 150 eV and a photoelectron take-off angle of 85°. The first integrated intensity ratio is a ratio of a sum of an integrated intensity of gallium element present as digallium monoxide and an integrated intensity of gallium element present as digallium trioxide to an integrated intensity of gallium element present as gallium arsenide and is 12 or less. The second integrated intensity ratio is a ratio of the sum of the integrated intensity of gallium element present as the digallium monoxide and the integrated intensity of gallium element present as the digallium trioxide to a sum of an integrated intensity of arsenic element present as diarsenic pentoxide and an integrated intensity of arsenic element present as diarsenic trioxide and is 1.2 or less. The number of particles present on the main surface and each having a major axis of 0.16 μm or more is 2 or less per $cm^2$ of the main surface.

A gallium arsenide single crystal substrate according to the present disclosure includes a main surface having a circular shape. The gallium arsenide single crystal substrate has a first analytical value or a second analytical value. The first analytical value and the second analytical value are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under the following five different conditions and subjecting the spectrum to a maximum smoothness method which is a mathematical analysis method. The first analytical value is a value representing a content of gallium oxides present as digallium monoxide and digallium trioxide in a region from the main surface of the gallium arsenide single crystal substrate to a depth of 2 nm and is 0.6 nm or less. The second analytical value is a value representing a ratio of the content of the gallium oxides to a content of arsenic oxides present as diarsenic pentoxide and diarsenic trioxide in the region from the main surface of the gallium arsenide single crystal substrate to a depth of 2 nm and is 1.4 or less. The number of particles present on the main surface and each having a major axis of 0.16 μm or more is 2 or less per $cm^2$ of the main surface. The five different conditions are the following condition 1, condition 2, condition 3, condition 4, and condition 5.

Condition 1: incident X-ray energy of 150 eV, and photoelectron take-off angle of 30°
Condition 2: incident X-ray energy of 150 eV, and photoelectron take-off angle of 45°
Condition 3: incident X-ray energy of 150 eV, and photoelectron take-off angle of 85°
Condition 4: incident X-ray energy of 600 eV, and photoelectron take-off angle of 45°
Condition 5: incident X-ray energy of 600 eV, and photoelectron take-off angle of 85°

A method of manufacturing a gallium arsenide single crystal substrate according to the present disclosure is a method of manufacturing a gallium arsenide single crystal substrate having a main surface having a circular shape. The method includes: preparing a gallium arsenide single crystal substrate precursor having a surface having a circular shape; and cleaning for obtaining the gallium arsenide single crystal substrate from the gallium arsenide single crystal substrate precursor. The cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface. The turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes. An acid concentration in the acid cleaning liquid is 0.5% by mass or more and less than 2% by mass.

A method of manufacturing a gallium arsenide single crystal substrate according to the present disclosure is a method of manufacturing a gallium arsenide single crystal substrate having a main surface having a circular shape. The method includes preparing a gallium arsenide single crystal substrate precursor having a surface having a circular shape, and cleaning for obtaining the gallium arsenide single crystal substrate from the gallium arsenide single crystal substrate precursor. The cleaning includes, turning the surface of the gallium arsenide single crystal substrate precursor into an alkali-cleaned surface by cleaning the surface with an alkali cleaning liquid, turning the alkali-cleaned surface into an acid-cleaned surface by cleaning the alkali-cleaned surface with an acid cleaning liquid, and obtaining the main surface by drying the acid-cleaned surface. The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant.

A method of manufacturing a gallium arsenide single crystal substrate according to the present disclosure is a method of manufacturing a gallium arsenide single crystal substrate having a main surface having a circular shape. The method includes, preparing a gallium arsenide single crystal substrate precursor having a surface having a circular shape, and cleaning for obtaining the gallium arsenide single crystal substrate from the gallium arsenide single crystal substrate precursor. The cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface. The turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes. The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant.

BRIEF DESCRIPTION OF DRAWINGS

FIG. 8 is a flowchart showing a method of manufacturing a third gallium arsenide single crystal substrate according to the present embodiment.

DETAILED DESCRIPTION

Figure 1A:
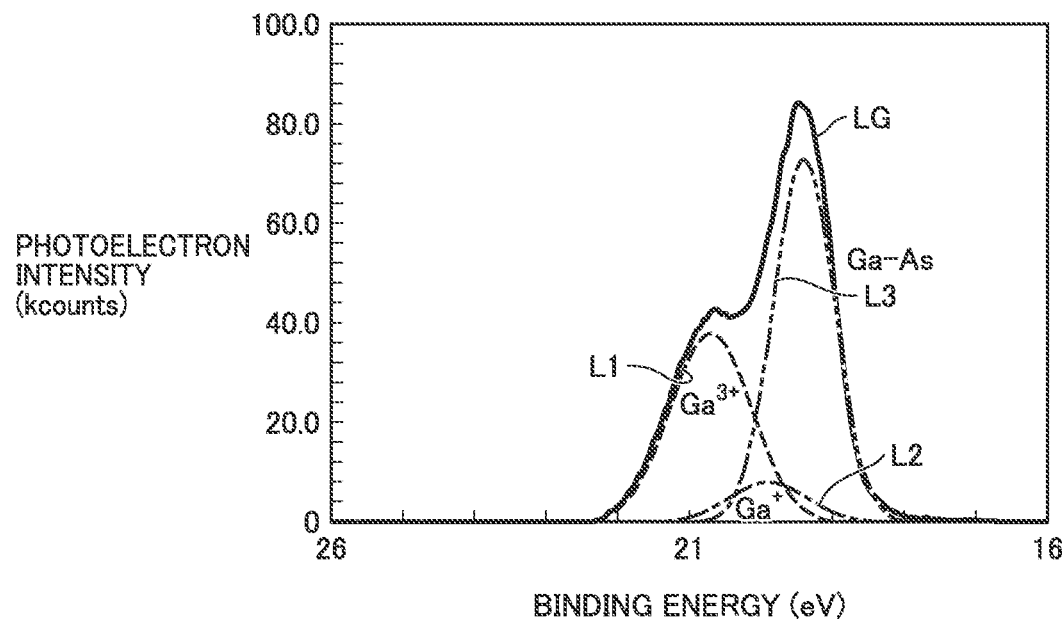
FIG. 1A is a graph showing an example of a Ga3d spectrum after background correction obtained by X-ray photoelectron spectroscopy using synchrotron radiation performed on a center of a main surface of a gallium arsenide single crystal substrate according to a first embodiment.

Problems to be Solved by Present Disclosure

Light point defects (LPDs) are one of indices for evaluating surface defects in an epitaxial film, and it is known that an increase in the number of LPDs is correlated with a deterioration of device characteristics. The LPDs mean surface defects detected by measuring light scattering caused by irradiating the epitaxial film with light when the epitaxial film has the surface defects. It is known that the LPDs are caused by factors attributable to a gallium arsenide single crystal substrate (such as surface particles) and other factors (such as an environment in an epitaxial growth furnace and a pre-growth environment). Due to these factors, an abnormality (crystal defects due to dislocations or the like) occurs locally during the epitaxial growth, and thus minute irregularities generated on the surface of the epitaxial layer are detected as light scattering. Since the LPDs are accompanied by the crystal defects, the LPDs cause the deterioration of the device characteristics.

In the present technical field, attempts have been made to reduce the number of LPDs on the surface of the epitaxial film grown on a main surface of a GaAs single crystal substrate by reducing the number of particles present on the main surface thereof. Here, the "particles" present on the main surface mean minute defects, foreign matters, and the like. However, even in a gallium arsenide single crystal substrate in which the number of particles is reduced, the number of LPDs on the surface of the epitaxial film grown on the main surface of the gallium arsenide single crystal substrate may not be sufficiently reduced. It is considered that the oxide film present on the main surface has an influence. However, even when the techniques disclosed in, for example, PTL 1 and PTL 2 are applied, there is a case where the number of LPDs is not sufficiently reduced unless the oxide film present on the main surface is sufficiently removed by thermal cleaning or the like, so that new development is desired.

In view of the above, an object of the present disclosure is to provide a gallium arsenide single crystal substrate and a method of manufacturing the same that enable formation of an epitaxial film having a reduced number of the LPDs to improve device characteristics.

Advantageous Effects of Present Disclosure

According to the present disclosure, it is possible to provide a gallium arsenide single crystal substrate and a method of manufacturing the same that enable formation of an epitaxial film having a reduced number of the LPDs to improve device characteristics.

Overview of Embodiment

First, an overview of embodiments of the present disclosure will be described. In order to solve the above-mentioned problem, the present inventors have conducted intensive studies and completed the present disclosure. That is, the present inventors have focused on obtaining a main surface of a gallium arsenide single crystal substrate that can further reduce LPDs on a surface of an epitaxial film when the epitaxial film is grown. Specifically, the present inventors have come up with the idea of reducing an oxide film present on the main surface which is one of the factors for the occurrence of the LPDs attributable to the gallium arsenide single crystal substrate, particularly the oxide film formed of gallium oxides, and have developed a novel cleaning method applied to a gallium arsenide single crystal substrate precursor cut out from a gallium arsenide single crystal. Here, alkali cleaning with an alkali cleaning liquid is effective in reducing the number of particles on the main surface. On the other hand, acid cleaning with an acid cleaning liquid is effective in reducing the oxide film on the main surface. However, when an acid concentration in the acid cleaning liquid is increased for the purpose of reducing the oxide film, the number of particles tends to increase.

In light of these findings, the present inventors newly performed an oxidation treatment step of forcibly oxidizing a surface of the gallium arsenide single crystal substrate precursor between the alkali cleaning step with the alkali cleaning liquid and the acid cleaning step with the acid cleaning liquid. Alternatively, instead of the oxidation treatment step and the subsequent acid cleaning step, a new acid cleaning step with an acid solution to which an additive such as a surfactant was added was performed. As a result, it has been found that the gallium arsenide single crystal substrate obtained by applying the above-described novel cleaning method has a reduced number of the particles on the main surface thereof, and has a reduced content of the gallium oxides in the oxide film formed on the main surface and having a thickness of about 0.5 to 2 nm. It is known that an oxide film having a lower content of the gallium oxides can be more easily removed by thermal cleaning. Therefore, the present inventors have achieved a GaAs single crystal substrate allowing formation of an epitaxial film in which the number of LPDs is sufficiently reduced by reducing the number of the particles and effectively removing the oxide film by thermal cleaning, and have completed the present disclosure.

Embodiments of the present disclosure are listed and described below.

[1] A gallium arsenide single crystal substrate according to one embodiment of the present disclosure includes a main surface having a circular shape. The gallium arsenide single crystal substrate has a first integrated intensity ratio or a second integrated intensity ratio. The first integrated intensity ratio and the second integrated intensity ratio are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under a condition of an incident X-ray energy of 150 eV and a photoelectron take-off angle of 85°. The first integrated intensity ratio is a ratio of a sum of an integrated intensity of gallium element present as digallium monoxide and an integrated intensity of gallium element present as digallium trioxide to an integrated intensity of gallium element present as gallium arsenide and is 12 or less. The second integrated intensity ratio is a ratio of the sum of the integrated intensity of gallium element present as the digallium monoxide and the integrated intensity of gallium element present as the digallium trioxide to a sum of an integrated intensity of arsenic element present as diarsenic pentoxide and an integrated intensity of arsenic element present as diarsenic trioxide and is 1.2 or less. The number of particles present on the main surface and each having a major axis of 0.16 µm or more is 2 or less per $cm^2$ of the main surface. In the gallium arsenide single crystal substrate having such features, since the number of particles is small and the oxide film can be effectively removed by thermal cleaning, an epitaxial film having a reduced number of the LPDs can be formed thereon.

[2] The first integrated intensity ratio is preferably 10.5 or less, and the second integrated intensity ratio is preferably 1.05 or less. Thereby, an epitaxial film in which the number of LPDs is further reduced can be formed thereon.

[3] The gallium arsenide single crystal substrate may have a diameter of 75 mm or more. The gallium arsenide single crystal substrate may have a third integrated intensity ratio or a fourth integrated intensity ratio. The third integrated intensity ratio and the fourth integrated intensity ratio may be each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which five measurement points on the main surface are irradiated with X-rays under the condition. The third integrated intensity ratio may be an average value of the ratio of the sum of the integrated intensity of gallium element present as the digallium monoxide and the integrated intensity of gallium element present as the digallium trioxide to the integrated intensity of gallium element present as the gallium arsenide and is 13.7 or less. The fourth integrated intensity ratio may be an average value of the ratio of the sum of the integrated intensity of gallium element present as the digallium monoxide and the integrated intensity of gallium element present as the digallium trioxide to the sum of the integrated intensity of arsenic element present as the diarsenic pentoxide and the integrated intensity of arsenic element present as the diarsenic trioxide and may be 1.23 or less. An average value of the number of particles measured at the five measurement points and each having a major axis of 0.16 µm or more may be 1.6 or less per $cm^2$ of the main surface. When the diameter of the gallium arsenide single crystal substrate is represented by D, and two axes passing through the center of the main surface and being orthogonal to each other on the main surface are defined as an X-axis and a Y-axis, coordinates (X, Y) of the five measurement points on the X-axis and the Y-axis may be (0, 0), (D/2−15, 0), (0, D/2−15), (−(D/2−15), 0), and (0, −(D/2−15)). The D, and X and Y in the coordinates (X, Y) is preferably expressed in units of mm. This enables formation of an epitaxial film having a further reduced number of LPDs uniformly in the main surface of the gallium arsenide single crystal substrate.

[4] A gallium arsenide single crystal substrate according to one embodiment of the present disclosure includes a main surface having a circular shape. The gallium arsenide single crystal substrate has a first analytical value or a second analytical value. The first analytical value and the second analytical value are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under each of the following five different conditions and subjecting the spectrum to a maximum smoothness method which is a mathematical analysis method. The first analytical value is a value representing a content of gallium oxides present as digallium monoxide and digallium trioxide in a region from the main surface of the gallium arsenide single crystal substrate to a depth of 2 nm and is 0.6 nm or less. The second analytical value is a value representing a ratio of the content of the gallium oxides to a content of arsenic oxides present as diarsenic pentoxide and diarsenic trioxide in the region from the main surface of the gallium arsenide single crystal substrate to a depth of 2 nm and is 1.4 or less. The number of particles present on the main surface and each having a major axis of 0.16 μm or more is 2 or less per cm$^2$ of the main surface. The five different conditions are the following condition 1, condition 2, condition 3, condition 4, and condition 5.

Condition 1: incident X-ray energy of 150 eV, and photoelectron take-off angle of 30°
Condition 2: incident X-ray energy of 150 eV, and photoelectron take-off angle of 45°
Condition 3: incident X-ray energy of 150 eV, and photoelectron take-off angle of 85°
Condition 4: incident X-ray energy of 600 eV, and photoelectron take-off angle of 45°
Condition 5: incident X-ray energy of 600 eV, and photoelectron take-off angle of 85°

In the gallium arsenide single crystal substrate having such features, since the number of particles is small and the oxide film can be effectively removed by thermal cleaning, an epitaxial film in which the number of LPDs is reduced can be formed thereon.

[5] The first analytical value is preferably 0.48 nm or less, and the second analytical value is preferably 1.2 or less. Thereby, an epitaxial film in which the number of LPDs is further reduced can be formed thereon.

[6] The gallium arsenide single crystal substrate may have a diameter of 75 mm or more. The gallium arsenide single crystal substrate may have a third analytical value or a fourth analytical value. The third analytical value and the fourth analytical value may be each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which five measurement points on the main surface are irradiated with X-rays under the five different conditions and subjecting the spectrum to the maximum smoothness method. The third analytical value may be a value representing an average value of the content of the gallium oxides present as the digallium monoxide and the digallium trioxide in a region from the main surface of the gallium arsenide single crystal substrate to a depth of 2 nm and is 0.57 nm or less. The fourth analytical value may be a value representing an average value of the ratio of the content of the gallium oxides to the content of the arsenic oxides present as the diarsenic pentoxide and the diarsenic trioxide in the region from the main surface of the gallium arsenide single crystal substrate to a depth of 2 nm and is 1.37 or less. An average value of the number of particles measured at the five measurement points and each having a major axis of 0.16 μm or more may be 1.6 or less per cm$^2$ of the main surface. When the diameter of the gallium arsenide single crystal substrate is represented by D, and two axes passing through the center of the main surface and being orthogonal to each other on the main surface are defined as an X-axis and a Y-axis, coordinates (X, Y) of the five measurement points on the X-axis and the Y-axis may be (0, 0), (D/2−15, 0), (0, D/2−15), (−(D/2−15), 0), and (0,−(D/2−15)). The D, and X and Y in the coordinates (X, Y) is preferably expressed in units of mm. This enables formation of an epitaxial film having a further reduced number of LPDs uniformly in the main surface of the gallium arsenide single crystal substrate.

[7] The gallium arsenide single crystal substrate preferably have a diameter of 75 mm to 205 mm. Thus, an epitaxial film having a reduced number of the LPDs can be formed on a gallium arsenide single crystal substrate having a diameter of 75 mm to 205 mm.

[8] A method of manufacturing a gallium arsenide single crystal substrate according to one embodiment of the present disclosure is a method of manufacturing a gallium arsenide single crystal substrate having a main surface having a circular shape. The method includes preparing a gallium arsenide single crystal substrate precursor having a surface having a circular shape, and cleaning for obtaining the gallium arsenide single crystal substrate from the gallium arsenide single crystal substrate precursor. The cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface. The turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes. An acid concentration in the acid cleaning liquid is 0.5% by mass or more and less than 2% by mass. The manufacturing method having such features enables formation of a gallium arsenide single crystal substrate having a main surface on which the number of particles is small and an oxide film can be effectively removed by thermal cleaning.

[9] A method of manufacturing a gallium arsenide single crystal substrate according to one embodiment of the present disclosure is a method of manufacturing a gallium arsenide single crystal substrate having a main surface having a circular shape. The method includes: preparing a gallium arsenide single crystal substrate precursor having a surface having a circular shape; and cleaning for obtaining the gallium arsenide single crystal substrate from the gallium arsenide single crystal substrate precursor. The cleaning includes turning the surface of the gallium arsenide single crystal substrate precursor into an alkali-cleaned surface by cleaning the surface with an alkali cleaning liquid, turning the alkali-cleaned surface into an acid-cleaned surface by cleaning the alkali-cleaned surface with an acid cleaning liquid, and obtaining the main surface by drying the acid-cleaned surface. The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant. The manufacturing method having such features enables formation of a gallium arsenide single crystal substrate having a main surface on which the number of particles is small and an oxide film can be effectively removed by thermal cleaning.

A method of manufacturing a gallium arsenide single crystal substrate according to one embodiment of the present disclosure is a method of manufacturing a gallium arsenide single crystal substrate having a main surface having a circular shape. The method includes: preparing a gallium arsenide single crystal substrate precursor having a surface having a circular shape; and cleaning for obtaining the gallium arsenide single crystal substrate from the gallium arsenide single crystal substrate precursor. The cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface. The turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes. The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant. The manufacturing method having such features enables formation of a gallium arsenide single crystal substrate having a main surface on which the number of particles is small and an oxide film can be effectively removed by thermal cleaning.

Details of Embodiment

Hereinafter, an embodiment according to the present disclosure will be described in more detail. However, the present disclosure is not limited thereto. The following description may be made with reference to the drawings. In the present description and the drawings, the same or corresponding elements are designated by the same reference numerals and the same description thereof will not be repeated. In the drawings, the scale of each element is adjusted as necessary to facilitate understanding, and the scale of each element shown in the drawings does not necessarily coincide with the scale of the actual element.

In the present description, the notation in the form of "A to B" means a lower limit and an upper limit of a range (that is, A or more and B or less), and when there is no description of a unit for A and a unit is described only for B, the unit of A and the unit of B are the same. Furthermore, in the present description, when a compound or the like is represented by a chemical formula, any conventionally known atomic ratio is included unless the atomic ratio is particularly limited, and the compound or the like should not necessarily be limited only to a stoichiometric range.

In the present description, as used herein, the term "main surface" of a gallium arsenide single crystal substrate means each of both the two surfaces of the substrate with circular shapes. A gallium arsenide single crystal substrate falls within the scope of the present invention when at least one of the two surfaces satisfies the claims according to the present disclosure. An epitaxial film may be disposed on the "main surface" of the gallium arsenide single crystal substrate. In addition, in the present description, the term "plane" used in the term "in-plane" means the "main surface". Further, when it is described that a diameter of the gallium arsenide single crystal substrate is "75 mm", it means that the diameter is around 75 mm (about 75 to 76.5 mm) or 3 inches. When it is described that a diameter is "100 mm", it means that the diameter is around 100 mm (about 95 to 105 mm) or 4 inches. When it is described that a diameter is "150 mm", it means that the diameter is around 150 mm (about 145 to 155 mm) or 6 inches. When it is described that a diameter is "200 mm", it means that the diameter is around 200 mm (about 195 to 205 mm) or 8 inches. The diameter can be measured by using a conventionally known outer diameter measuring instrument such as a vernier caliper.

In crystallographic denotation in the present description, an individual orientation, a group orientation, an individual plane, and a group plane are shown in [ ], < >, ( ) and { }, respectively. A crystallographically negative index is normally expressed by a number with a bar "-" thereabove, however, a negative sign precedes a number in the present description.

[Gallium Arsenide Single Crystal Substrate: First Embodiment]

A gallium arsenide single crystal substrate (GaAs single crystal substrate) according to a first embodiment is a GaAs single crystal substrate including a main surface having a circular shape. The GaAs single crystal substrate has a first integrated intensity ratio or a second integrated intensity ratio. The first integrated intensity ratio and the second integrated intensity ratio are each obtained by determining a spectrum of a detected intensity of a 3d electron of each of arsenic (As) and gallium (Ga) with respect to a binding energy of a photoelectron emitted to an outside of the GaAs single crystal substrate based on X-ray photoelectron spectroscopy in which a center of the main surface is irradiated with X-rays under a condition of an incident X-ray energy of 150 eV and a photoelectron take-off angle of 85°. The first integrated intensity ratio is a ratio of a sum of an integrated intensity of Ga element (hereinafter referred to as "$Ga^+$" for convenience) present as digallium monoxide $Ga_2O$ and an integrated intensity of Ga element (hereinafter referred to as "$Ga^{3+}$" for convenience) present as digallium trioxide $Ga_2O_3$ to an integrated intensity of Ga element (hereinafter referred to as "Ga—As" for convenience) present as gallium arsenide (GaAs) and is 12 or less. The second integrated intensity ratio is a ratio of the sum of the integrated intensity of the Ga element (Ga) present as the $Ga_2O$ and the integrated intensity of Ga element ($Ga^{3+}$) present as the $Ga_2O_3$ to a sum of an integrated intensity of As element (hereinafter, referred to as "$As^{5+}$" for convenience) present as diarsenic pentoxide ($As_2O_5$) and an integrated intensity of As element (hereinafter referred to as "$As^{3+}$" for convenience) present as diarsenic trioxide ($As_2O_3$) and is 1.2 or less. The number of particles present on the main surface and each having a major axis of 0.16 μm or more is 2 or less per $cm^2$ of the main surface. In the GaAs single crystal substrate having such features, since the number of particles is small and the oxide film can be effectively removed by thermal cleaning, an epitaxial film in which the number of LPDs is reduced can be formed thereon.

<Main Surface>

As described above, the GaAs single crystal substrate includes the main surface having a circular shape. In the present description, the term "circular" representing the shape of the main surface includes not only a geometrically circular shape but also a shape in a case where the main surface does not form a geometrically circular shape due to formation of at least one of a notch, an orientation flat (hereinafter also referred to as "OF"), or an index flat (hereinafter also referred to as "IF"). That is, "shape in a case where the main surface does not form a geometrically circular shape" means a shape in the case where line segments extending from any point on the notch, the OF, and the IF to a center of the main surface among line segments extending from any point on an outer periphery of the main surface to the center of the main surface have shorter lengths. In other words, in the present specification, the shape of the main surface is defined as being "circular" based on the shape before the notch, the OF, and the IF are formed. For this reason, the position of the center of the main surface and the size (length) of the diameter of the substrate are obtained based on the circular shape before the notch, the OF, the IF, and the like are formed. Furthermore, "a shape in a case where the main surface does not form a geometrically circular shape" includes a shape in a case where lengths of all the line segments extending from any point on the outer periphery of the main surface to the center of the main surface are not necessarily the same due to a shape of a gallium arsenide single crystal before the gallium arsenide single crystal substrate is cut out. In this case, the center of the main surface refers to a position of the center of gravity, and the diameter of the substrate refers to a length of the longest line segment among line segments extending from any point on the outer periphery of the substrate to another point on the outer periphery through the center of the main surface.

<X-Ray Photoelectron Spectroscopy (XPS) Using Synchrotron Radiation>

In the course of developing a GaAs single crystal substrate that enables formation of an epitaxial film having a reduced number of the LPDs, the present inventors have focused on X-ray photoelectron spectroscopy (XPS) using synchrotron radiation that enables more precise analysis of a state of the main surface of the GaAs single crystal substrate. Specifically, by performing XPS using synchrotron radiation, the cause of deterioration of characteristics of the main surface in the GaAs single crystal substrate was identified, and by eliminating the cause, an attempt was made to achieve a GaAs single crystal substrate that enables formation of an epitaxial film having a reduced number of the LPDs. Here, XPS refers to an analysis technique in which a sample is irradiated with X-rays and a kinetic energy distribution of photoelectrons emitted from the sample is measured to obtain findings related to types, amounts, chemical bonding states, and the like of elements present on a surface of the sample.

In general, when the main surface of the GaAs single crystal substrate is analyzed by XPS, the analysis is often performed using X-rays having an energy fixed around 1.487 keV. However, when X-rays having an incident energy fixed around 1.487 keV are used and a photoelectron take-off angle is set to 30°, findings related to the state of the main surface of the GaAs single crystal substrate are obtained as an averaged state of a region from the main surface to a depth of about 5 nm. The region corresponds to about 20 atomic layers in terms of atomic layers. Therefore, it has been difficult to accurately analyze the state of the main surface of the GaAs single crystal substrate by the XPS. Furthermore, if it is attempted to obtain findings related to the state of the main surface of the GaAs single crystal substrate by shifting the photoelectron take-off angle using X-rays having an incident energy fixed around 1.487 keV with XPS, a measurement error with respect to the angle becomes too large, and, furthermore, a measurement error becomes large due to a low ionization efficiency of the photoelectron intensity. Thus, it has been difficult to conduct an accurate analysis.

On the other hand, for the GaAs single crystal substrate according to the first embodiment, the state of the main surface of the substrate is analyzed by performing XPS under a condition of an incident X-ray energy of 150 eV and a photoelectron take-off angle of 85°. In this case, findings related to the state of the main surface of the GaAs single crystal substrate are obtained as an averaged state of a region from the main surface to a depth of about 1.75 nm.

With respect to a GaAs single crystal substrate, it is conventionally known that an oxide film having a thickness of about 0.5 to 2 nm is formed on the main surface after cleaning in cleaning step. Therefore, an attempt has been made that an epitaxial film is formed on the main surface after the oxides are removed by thermal cleaning in order to reduce the number of LPDs on the surface of the epitaxial film. However, even after the thermal cleaning, the number of LPDs on the surface of the epitaxial film has increased to a certain extent because a part of the oxide film remains on the main surface. On the other hand, the present inventors have focused on detailed analysis of a vicinity of an interface (i.e., a region at a depth of about 0.5 to 2 nm from the main surface of the GaAs single crystal substrate) between the oxide film on the main surface of the GaAs single crystal substrate and a layer (hereinafter also referred to as "main layer" of the GaAs single crystal substrate) formed of Ga and As immediately under the oxide film by XPS using the above-described synchrotron radiation. As a result, it was found that, in the GaAs single crystal substrate, the oxide film can be more effectively removed from the main layer by thermal cleaning as the content of gallium oxides ($Ga_2O$ and $Ga_2O_3$) in a composition of the oxide film in the vicinity of the interface decreases. That is, the present inventors have reached an idea that, by appropriately controlling the composition of the oxide film in the vicinity of the interface, the oxide film on the main surface can be completely removed by thermal cleaning, thereby when an epitaxial film is grown on the main surface, the LPDs on the surface of the epitaxial film can be reduced.

<First Integrated Intensity Ratio and Second Integrated Intensity Ratio>

The GaAs single crystal substrate according to the first embodiment has a first integrated intensity ratio or a second integrated intensity ratio. The first integrated intensity ratio and the second integrated intensity ratio are each obtained, based on XPS in which a center of the main surface is irradiated with X-rays under a condition of an incident X-ray energy of 150 eV and a photoelectron take-off angle of 85°, by determining spectra of detected intensities of 3d electrons of As and Ga with respect to binding energy of a photoelectron emitted to an outside of the GaAs single crystal substrate. The GaAs single crystal substrate according to the first embodiment preferably have both the first integrated intensity ratio and the second integrated intensity ratio.

The first integrated intensity ratio is a ratio of a sum of an integrated intensity of Ga element ($Ga^+$) present as $Ga_2O$ and an integrated intensity of Ga element ($Ga^{3+}$) present as $Ga_2O_3$ to an integrated intensity of Ga element (Ga—As) present as GaAs and is 12 or less. The second integrated intensity ratio is a ratio of the sum of the integrated intensity of Ga element ($Ga^+$) present as the $Ga_2O$ and the integrated intensity of Ga element ($Ga^{3+}$) present as the $Ga_2O_3$ to a sum of an integrated intensity of As element ($As^{5+}$) present as $As_2O_5$ and an integrated intensity of As element ($As^{3+}$) present as $As_2O_3$ and is 1.2 or less.

When the first integrated intensity ratio is represented by $R_1$ and the second integrated intensity ratio is represented by $R_2$, the first integrated intensity ratio ($R_1$) and the second integrated intensity ratio ($R_2$) can be expressed by the following equations.

$$R_1 = \frac{I(Ga_2O) + I(Ga_2O_3)}{I(GaAs)} \leq 12$$

$$R_2 = \frac{I(Ga_2O) + I(Ga_2O_3)}{I(As_2O_5) + I(As_2O_3)} \leq 1.2$$

The first integrated intensity ratio of 12 or less means that the content of gallium oxides ($Ga_XO$: $Ga_2O$ and $Ga_2O_3$) is low in the composition of the oxide film in the vicinity of the interface between the main layer and the oxide film located at a depth of about 0.5 to 2 nm from the main surface. The second integrated intensity ratio of 1.2 or less means that the content of the gallium oxides ($Ga_XO$) in the composition of the oxide film in the vicinity of the interface between the main layer and the oxide film located at a depth of about 0.5 to 2 nm from the main surface is approximately equal to or less than that of arsenic oxides ($As_XO$: $As_2O_5$ and $As_2O_3$). In these cases, it is considered that the oxide film is effectively removed by thermal cleaning because a separation temperature becomes lower due to a lower content of the gallium oxides ($Ga_XO$). In particular, the first integrated intensity ratio is preferably 10.5 or less, and the second integrated intensity ratio is preferably 1.05 or less. The first integrated intensity ratio is more preferably 2.7 or less, and the second integrated intensity ratio is more preferably 0.65 or less.

As a result, in the GaAs single crystal substrate according to the first embodiment, when an epitaxial film is grown on the main surface after thermal cleaning, the number of LPDs on the surface of the epitaxial film can be reduced further than that in a conventional art.

On the other hand, in a conventional GaAs single crystal substrate, the first integrated intensity ratio exceeds 12, or the second integrated intensity ratio exceeds 1.2. In such a GaAs single crystal substrate, a part of the oxide film may remain on the main surface even after thermal cleaning. Therefore, when an epitaxial film is formed on the main surface of the GaAs single crystal substrate after the thermal cleaning, there is a likelihood that steps are formed on the surface and thus the number of LPDs increases.

As described above, the present inventors have found for the first time that the number of LPDs on the surface of the epitaxial film formed on the main surface of the GaAs single crystal substrate depends on the content of the gallium oxides ($Ga_XO$) in the vicinity of the interface (a region at a depth of about 0.5 to 2 nm from the main surface) between the oxide film and the main layer. In particular, such a technique for reducing the number of LPDs based on the content of the gallium oxides ($Ga_XO$) in the oxide film can be compatible with a technique for reducing the number of particles, as will be described in the section of [Method of Manufacturing Gallium Arsenide Single Crystal Substrate] to be described later.

FIG. 1A is a graph showing an example of a Ga3d spectrum after background correction obtained from X-ray photoelectron spectroscopy using synchrotron radiation performed on a center of a main surface of a gallium arsenide single crystal substrate according to the first embodiment.

Figure 1B:
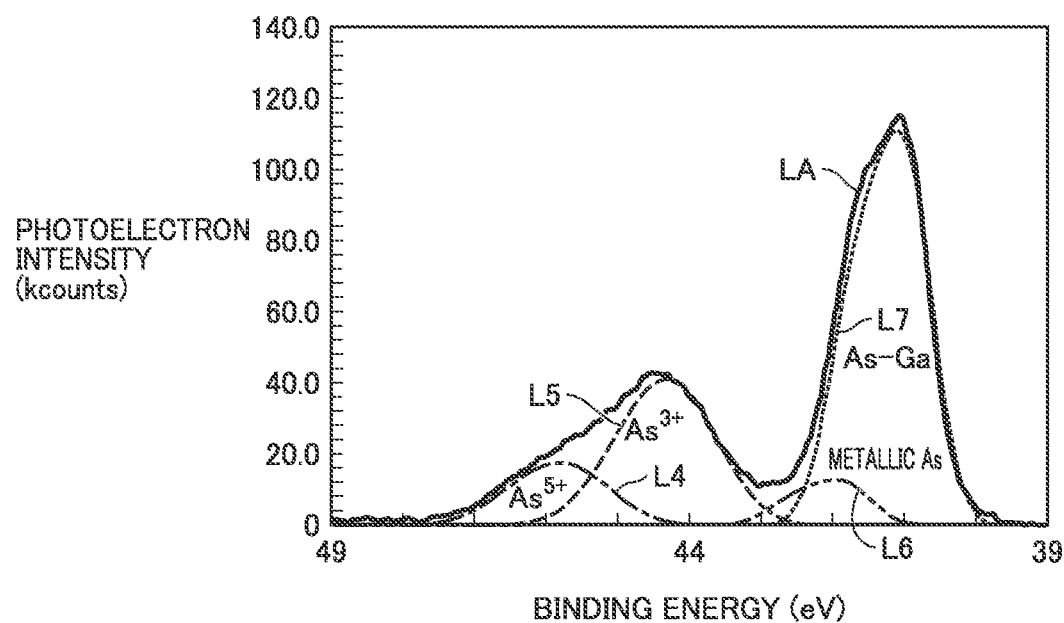
FIG. 1B is a graph showing an example of an As3d spectrum after background correction obtained by X-ray photoelectron spectroscopy using synchrotron radiation performed on the center of the main surface of the gallium arsenide single crystal substrate according to the first embodiment.

FIG. 1B is a graph showing an example of an As3d spectrum after background correction obtained by X-ray photoelectron spectroscopy using synchrotron radiation performed on the center of the main surface of the gallium arsenide single crystal substrate according to the first embodiment. A specific analysis method by X-ray photoelectron spectroscopy (XPS) using synchrotron radiation for obtaining the Ga3d spectrum and the As3d spectrum after the background correction will be described later.

As shown in FIG. 1A and FIG. 1B, by performing peak separation of the Ga3d spectrum LG, a $Ga^{3+}$ spectrum L1 of Ga element ($Ga^{3+}$) present as $Ga_2O_3$, a $Ga^+$ spectrum L2 of Ga element ($Ga^+$) present as $Ga_2O$, and a Ga—As spectrum L3 of Ga element present as GaAs (i.e., the Ga element bonded to As: Ga—As) can be expressed separately. In the same manner, by performing peak separation of the As3d spectrum LA, an $As^{5+}$ spectrum L4 of As element ($As^{5+}$) present as $As_2O_5$, an $As^{3+}$ spectrum L5 of As element ($As^{3+}$) present as $As_2O_3$, a metallic As spectrum L6 of As element (metallic As) present as metallic As, and an As—Ga spectrum L7 of As element (i.e., an As element bonded to Ga: As—Ga) present as GaAs can be expressed separately. Here, metallic As is produced from the oxide film and the main layer by a reaction of $2GaAs + As_2O_3 \rightarrow Ga_2O_3 + 4As$. The "peak separation" will be described later.

In FIG. 1A, an area of a region surrounded by the curve of $Ga^{3+}$ spectrum L1 and the horizontal axis (X-axis) corresponds to the number of photoelectrons emitted from a 3d orbit of $Ga^{3+}$, and thus means the integrated intensity of $Ga^{3+}$. An area of a region surrounded by the curve of $Ga^+$ spectrum L2 and the horizontal axis (X-axis) corresponds to the number of photoelectrons emitted from the 3d orbital of $Ga^+$, and thus means the integrated intensity of $Ga^+$. An area of a region surrounded by the curve of Ga—As spectrum L3 and the horizontal axis (X-axis) corresponds to the number of photoelectrons emitted from a 3d orbital of Ga—As, and thus means the integrated intensity of Ga—As.

In FIG. 1B, an area of a region surrounded by the curve of $As^{5+}$ spectrum L4 and the horizontal axis (X-axis) corresponds to the number of photoelectrons emitted from a 3d orbit of $As^{5+}$, and thus means the integrated intensity of $As^{5+}$. An area of a region surrounded by the curve of $As^{3+}$ spectrum L5 and the horizontal axis (X-axis) corresponds to the number of photoelectrons emitted from a 3d orbit of $As^{3+}$, and thus means the integrated intensity of $As^{3+}$. An area of a region surrounded by the curve of metallic As spectrum L6 and the horizontal axis (X-axis) corresponds to the number of photoelectrons emitted from a 3d orbit of metallic As, and thus means the integrated intensity of metallic As. An area of a region surrounded by the curve of As—Ga spectrum L7 and the horizontal axis (X-axis) corresponds to the number of photoelectrons emitted from a 3d orbital of As—Ga, and thus means the integrated intensity of As—Ga.

Therefore, based on areas obtained by the spectra and the horizontal axis described above, the ratio of the sum of the integrated intensity of Ga and the integrated intensity of $Ga^{3+}$ to the integrated intensity of Ga—As can be obtained as the first integrated intensity ratio. In addition, the ratio of the sum of the integrated intensity of $Ga^+$ and the integrated intensity of $Ga^{3+}$ to the sum of the integrated intensity of $As^{5+}$ and the integrated intensity of $As^{3+}$ can be obtained as the second integrated intensity ratio.

<Particles Each Having Major Axis of 0.16 Um or More>

In the GaAs single crystal substrate according to the first embodiment, the number of particles present on the main surface and each having a major axis of 0.16 µm or more is 2 or less per cm² of the main surface. This, together with the effect obtained by a low content of the gallium oxides in the oxide film, can further reduce the number of LPDs in the epitaxial film formed on the main surface. The number of particles present on the main surface and each having a major axis of 0.16 μm or more is preferably 5 or less, more preferably 2 or less, per cm² of the main surface. The lower limit of the number of particles present on the main surface and each having a major axis of 0.16 μm or more is ideally zero per cm² of the main surface, but is practically 0.1 or more per cm² of the main surface.

The particles can be observed by using a surface inspection apparatus (trade name: "Surfscan 6220", manufactured by KLA-Tencor Corporation), and the number of the particles can be determined. A specific observation method is as follows. First, a total number of protrusions such as foreign matters is determined by scanning the entire surface of the GaAs single crystal substrate with a laser using the surface inspection apparatus. Next, the total number of protrusions is divided by an area of a target region for measurement in the GaAs single crystal substrate to obtain the number of particles per cm² present on the main surface. In this case, a region of the substrate within 5 mm from an outer edge thereof is not included in the entire surface of the GaAs single crystal substrate. This is because the region is not usually used as a substrate for devices.

The surface inspection apparatus is adjusted so that only protrusions each having a major axis of 0.16 μm or more are counted to be included in the number of protrusions. This is because the number of particles each having a major axis of 0.16 μm or more correlates with the number of LPDs. Furthermore, it is suitable not to count particles each having a measured major axis of less than 0.16 μm because the reliability of determining whether or not the particles are true particles under the present measurement conditions is low. Here, the term "major axis" of each of the particles refers to a distance between two points that are most distant from each other on an outer periphery of the protrusion. A maximum value of the major axis of the protrusion is not particularly limited, but is 5 μm, for example. This is because the cleanliness of a clean room for manufacturing a semiconductor is regulated, and it is substantially impossible for a foreign matter exceeding 5 μm in size to be mixed into a clean room of a class 100, so that it is substantially impossible for the foreign matter exceeding 5 μm in size to be present on the main surface of a GaAs single crystal substrate.

<Diameter>

The GaAs single crystal substrate preferably has a diameter of 75 mm to 205 mm. In other words, the diameter of the GaAs single crystal substrate is preferably 3 to 8 inches. As a result, the oxide film can be effectively removed by thermal cleaning in the GaAs single crystal substrate having a diameter of 75 mm to 205 mm. Here, with respect to the diameter, even if the substrate does not have a geometrically circular shape due to the influence of an OF, an IF, and the like, the size (diameter) of the substrate is determined by regarding the substrate as having the same circular shape as a circular shape in a state before the OF, the IF, and the like is formed.

<Specific Analysis Method of XPS Using Synchrotron Radiation>

Hereinafter, a specific XPS analysis method using synchrotron radiation will be described in more detail.

(Analysis System)

Figure 2:
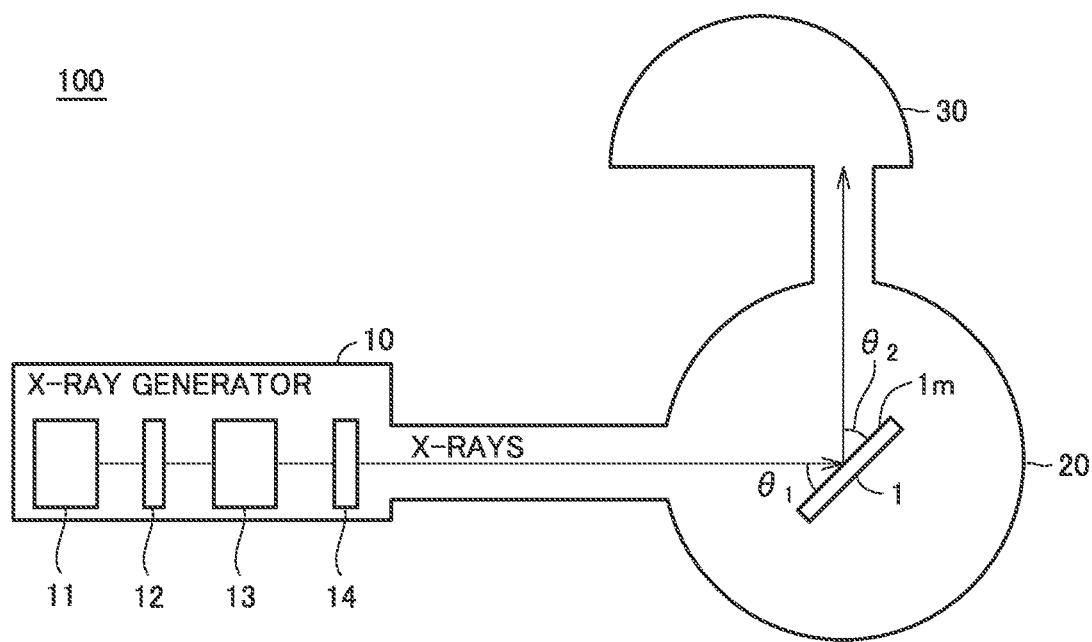
FIG. 2 is an explanatory diagram schematically showing a configuration of an analysis system using X-ray photoelectron spectroscopy.

FIG. 2 is an explanatory diagram schematically showing a configuration of an analysis system using X-ray photoelectron spectroscopy. As shown in FIG. 2, an analysis system 100 includes an X-ray generator 10, a vacuum vessel 20, and an electron spectrometer 30. X-ray generator 10, vacuum vessel 20, and electron spectrometer 30 are connected in this order. The internal spaces of X-ray generator 10, vacuum vessel 20, and the electron spectrometer 30 are maintained in an ultra-high vacuum. A pressure in the internal spaces of X-ray generator 10, vacuum vessel 20, and electron spectrometer 30 is $4 \times 10^{-7}$ Pa, for example.

X-ray generator 10 generates X-rays called synchrotron radiation. As X-ray generator 10, for example, a beam line "BL17" in Saga Prefecture Kyushu Synchrotron Light Research Center can be used.

X-ray generator 10 generates X-rays having any energy of 50 eV to 2000 eV in the beam line "BL17", for example, and irradiates a GaAs single crystal substrate 1 disposed in vacuum vessel 20 with the X-rays. X-ray generator 10 illustrated in FIG. 2 includes an X-ray source 11, slits 12 and 14, and a grating 13. Slits 12 and 14 are respectively disposed on an upstream side and a downstream side of grating (spectrometer) 13. Slits 12 and 14 are, for example, four-quadrant slits.

X-ray source 11 outputs synchrotron radiation (X-rays) radiated in a direction along a tangential line of a traveling direction by bending the traveling direction of high-energy electrons in a circular accelerator by a magnetic field generated by a deflection electromagnet.

The X-rays emitted from X-ray source 11 have a high brilliance. Specifically, the number of photons of X-rays emitted from X-ray source 11 per second is 109 photons/s. However, the brilliance (intensity) of the X-rays emitted from X-ray source 11 decays with time. For example, the brilliance of X-rays emitted 11 hours after X-ray source 11 is activated is ⅓ of the brilliance of X-rays emitted immediately after the activation.

The X-rays emitted from X-ray source 11 are collimated by a collimating mirror or the like (not shown). Slit 12 allows a part of the collimated X-rays to pass therethrough. The X-rays passed through slit 12 is monochromatized by grating 13. Slit 14 limits a spread of the monochromatized X-rays.

The energy of the X-rays emitted from X-ray generator 10 is determined by slit widths of slits 12 and 14, and a line density of grating 13. For example, by setting the slit widths of slits 12 and 14 to 30 μm, using grating 13 having a line density of 400 l/mm at the center thereof, and adjusting an emission angle of the grating, X-rays having an incident energy of 150 eV or 600 eV are emitted from X-ray generator 10.

In response to the irradiation of GaAs single crystal substrate 1 disposed in vacuum vessel 20 with X-rays from X-ray generator 10, photoelectrons are emitted from GaAs single crystal substrate 1.

Electron spectrometer 30 measures a kinetic energy distribution of the photoelectrons emitted from GaAs single crystal substrate 1. Electron spectrometer 30 includes a hemispherical analyzer and a detector. The hemispherical analyzer disperses the photoelectrons. The detector counts the number of photoelectrons at each energy.

An angle $\theta_1$ between a traveling direction of the X-rays incident on GaAs single crystal substrate 1 from X-ray generator 10 and a main surface $1m$ of GaAs single crystal substrate 1 is variable. In addition, an angle (hereinafter, referred to as "take-off angle $\theta_2$") between a traveling direction of photoelectrons captured by electron spectrometer 30 among the photoelectrons emitted from GaAs single crystal substrate 1 and main surface $1m$ of GaAs single crystal substrate 1 is also variable. In the first embodiment, take-off angle $\theta_2$ is set to 85°. Angle $\theta_1$ is not particularly limited, but is set to 5°, for example.

As electron spectrometer 30, for example, a high-resolution XPS analyzer "R3000" manufactured by Scienta Omicron, Inc. can be used.

(Depth from Main Surface to be Analyzed)

A part of photoelectrons emitted to the outside of GaAs single crystal substrate 1 by the irradiation with X-rays loses energy due to inelastic scattering. Therefore, only a part of the photoelectrons generated in GaAs single crystal substrate 1 is emitted into a vacuum while maintaining an energy at the time of generation, and reaches electron spectrometer 30. Photoelectrons emitted from the surface are generated at a depth corresponding to about three times an inelastic mean free path (IMFP) of the photoelectrons. Therefore, a depth d (nm) from the main surface of the GaAs single crystal substrate to be analyzed is expressed by the following equation. In the following equation, λ (nm) is an IMFP value, and $\theta_2$ is a take-off angle.

$$d = 3\lambda \sin\theta_2$$

Furthermore, as shown in "Method of estimating inelastic mean free path of electrons by Tpp-2M equation, Journal of Surface Analysis, Vol. 1, No. 2, 1995", the IMFP value λ (Å) is represented by each of the following equations.

$$\lambda = \frac{E}{E_p^2 \left[ \beta \ln(\gamma E) - C/E + D/E^2 \right]}$$

$$E_p = 28.8 \left( \frac{N_v \rho}{A_w} \right)^{1/2}$$

$$\beta = -0.10 + \frac{0.944}{(E_p^2 + E_g^2)^{\frac{1}{2}}} + 0.069\rho^{0.1}$$

$$\gamma = 0.191 \rho^{-0.50}$$

$$C = 1.97 - 0.94U$$

$$D = 53.4 - 20.8U$$

$$U = \frac{N_v \rho}{A_w} = \frac{E_p^2}{829.4}$$

In the above equations, Aw represents an atomic weight or a molecular weight, $N_v$ represents the number of valence electrons per atom or molecule, $E_p$ represents a plasmon energy (eV) of free electrons, p represents a density (g/cm³), and $E_g$ represents a band gap energy (eV). E represents a kinetic energy (eV) of photoelectron and is calculated from an irradiation energy (eV) of X-rays and a binding energy (eV) between an electron and an atomic nucleus.

By using the above equations, depth d (nm) from the main surface of the GaAs single crystal substrate to be analyzed can be determined. That is, depth d from the main surface of the GaAs single crystal substrate is calculated by using the above-described equations, various parameter values related to the 3d electrons of Ga elements in GaAs, $Ga_2O$, and $Ga_2O_3$, various parameter values related to the 3d electrons of As elements in AsGa, metallic As, $As_2O_5$, and $As_2O_3$, and an X-ray energy. In the first embodiment, an incident X-ray energy is 150 eV and a photoelectrons take-off angle is 85°, so that depth d in GaAs is about 1.75 nm, for example.

(Method of Calculating First Integrated Intensity Ratio and Second Integrated Intensity Ratio)

Hereinafter, a method of calculating a first integrated intensity ratio and a second integrated intensity ratio in the main surface based on XPS using the above-described synchrotron radiation will be described. In the present embodiment, first, XPS is performed on the center of the main surface of a GaAs single crystal substrate using X-rays having an energy of 150 eV. Thus, the kinetic energy distribution of photoelectrons emitted from the GaAs single crystal substrate can be obtained.

Kinetic energy E of photoelectrons emitted from the GaAs single crystal substrate is expressed by the following equation using an irradiation energy hv (eV) of the X-rays, binding energy $E_B$ (eV) of photoelectrons in the GaAs single crystal substrate, and a work function φ (eV).

$$E = h\nu - E_B - \varphi.$$

Using the above equation, a spectrum indicating a binding energy distribution of photoelectrons is generated from the kinetic energy distribution of photoelectrons emitted from the GaAs single crystal substrate. In the present embodiment, based on the kinetic energy distribution of photoelectrons emitted from a position at depth d (nm) from a main surface of the above-described GaAs single crystal substrate, a Ga3d spectrum and a As3d spectrum each indicating a binding energy distribution of photoelectrons are generated. In the present description, the term "Ga3d spectrum" refers to a spectrum representing detected intensities of photoelectrons emitted from 3d orbitals of Ga elements (Ga contained in $Ga_2O$, $Ga_2O_3$, and GaAs). The term "As3d spectrum" refers to a spectrum representing detected intensities of photoelectrons emitted from 3d orbitals of As elements (As contained in $As_2O_5$, $As_2O_3$, metallic As, and GaAs).

In particular, in the XPS analysis, from a viewpoint of accurate measurement, the Ga3d spectrum and the As3d spectrum are obtained by narrow-scanning in a predetermined binding energy range. Specifically, by narrow-scanning a range of binding energy from 16 to 26 eV, the Ga3d spectrum can be expressed in a graph in which a horizontal axis represents the above range and a vertical axis represents the detected intensity. By narrow-scanning a range of binding energy from 39 to 49 eV, the As3d spectrum can be expressed in a graph in which a horizontal axis represents the above range and a vertical axis represents the detected intensity.

The narrow-scanning is performed under a condition of an energy interval of 0.05 eV, an integration time of 100 ms at each energy value, and the number of integrations from 2 to 5. In addition, an energy resolution E/ΔE is 3480.

Ga3d spectrum LG and As3d spectrum LA as shown in FIG. 1A and FIG. 1B can be obtained in this manner. As described above, in FIG. 1A and FIG. 1B, examples of Ga3d spectrum and As3d spectrum after background correction are shown. That is, in order to obtain Ga3d spectrum LG and As3d spectrum LA, the background is corrected by using the Shirley method (reference: Yoshihara Kazuhiro: Journal of the Vacuum Society of Japan, Vol. 56, No. 6, pp. 243-247, 2013). Thus, Ga3d spectrum LG after background correction can be determined based on a difference between a Ga3d spectrum obtained based on actual measurement and the background. In addition, based on a difference between an As3d spectrum obtained based on actual measurement and the background, As3d spectrum LA after background correction can be determined.

In obtaining Ga3d spectrum LG, the peak of the detected intensity of Ga element (Ga$^+$) present as Ga$_2$O is fixed at a position where the binding energy is 19.9 eV, and the peak of the detected intensity of Ga element (Ga$^{3+}$) present as Ga$_2$O$_3$ is fixed at a position where the binding energy is 20.7 eV. Furthermore, the peak position of the detected intensity of Ga element (Ga—As) present as GaAs is set so as to fall within a range in which binding energy is about 19.2 to 19.7 eV. This is because when the X-ray photoelectron spectroscopy is performed on a GaAs single crystal, there is a likelihood that charge shift occurs and the Ga3d spectrum is shifted toward a higher energy by about 1 eV at the maximum. In addition, since the peak of the detected intensity of Ga—As is affected by the main layer made of GaAs, it is difficult to fix the peak at a single value, so that the peak position is set so as to have a width of 0.5 eV as described above.

In obtaining As3d spectrum LA, the peak of the detected intensity of As element (As$^{5+}$) present as As$_2$O$_5$ is fixed at a position where the binding energy is 45.57 eV, and the peak of the detected intensity of As element (As$^{3+}$) present as As$_2$O$_3$ is fixed at a position where the binding energy is 44.07 eV. Furthermore, the peak position of the detected intensity of As element present as metallic As (metallic As) is set so as to have a width of binding energy from about 41.62 to 42.12 eV, and the peak position of the detected intensity of As element present as GaAs (As—Ga) is set so as to fall within a range in which binding energy is about 40.77 to 41.27 eV. This is because when the X-ray photoelectron spectroscopy is performed on a GaAs single crystal, there is a likelihood that charge shift occurs and the As3d spectrum is shifted toward a higher energy by about 1 eV at the maximum. In addition, since the peaks of metallic As and As—Ga are affected by the main layer made of GaAs, it is difficult to fix each of the peaks at a single value, so that the peak positions are set so as to fall within a range of 0.5 eV as described above.

Next, Ga3d spectrum LG after the background correction obtained as described above is separated into the following three Gaussian functions Y1, Y2, and Y3 (hereinafter, this operation is also referred to as "peak separation"). As a result, three spectra of Ga element (Ga$^+$) present as Ga$_2$O, Ga element (Ga$^{3+}$) present as Ga$_2$O$_3$, and Ga element (Ga—As) present as GaAs can be obtained by peak separation in a range of binding energy from 16 to 26 eV.

$$Y1 = a1 * \exp\{(-(X - b1)^2)/c1^2\}$$
$$Y2 = a2 * \exp\{(-(X - b2)^2)/c2^2\}$$
$$Y3 = a3 * \exp\{(-(X - b3)^2)/c3^2\}$$

Gaussian functions Y1, Y2, and Y3 are expressed in dimensionless units, and in Gaussian functions Y1, Y2, and Y3, the X and the variables b1, b2, b3, c1, c2, and c3 are expressed in units of eV, and the variables a1, a2, and a3 are expressed in dimensionless units.

Gaussian functions Y1 to Y3 are obtained by optimizing the respective variables (a1, a2, a3, b1, b2, b3, c1, c2, and c3) so as to minimize the square of the difference from the actual measurement ([actual measurement–$\Sigma$Gi]$^2$) on a premise that the i-th component of Ga3d is represented by a Gaussian function Gi=Ai*exp{(–(E–E1)$^2$)/Wi$^2$}. Among the variables, the values of the binding energies at the peaks of the detected intensities of Ga$^+$, Ga$^{3+}$ and Ga—As described above are assigned to b1 to b3, respectively.

In other words, the variables (a1, a2, a3, b1, b2, b3, c1, c2, and c3) are as follows: a1, a2, and a3 are real numbers of zero or more,
b1=19.9 eV,
b2=20.7 eV,
19.2 eV≤ b3≤19.7 eV,
0.2 eV≤ c1≤0.95 eV,
0.2 eV≤ c2≤0.95 eV, and
0.2 eV≤ c3≤0.95 eV.

Thus, Gaussian functions Y1, Y2, and Y3 can be expressed, for example, as Ga$^+$ spectrum L2, Ga$^{3+}$ spectrum L1 and Ga—As spectrum L3, respectively, which are peak separated from Ga3d spectrum LG in FIG. 1A.

Furthermore, As3d spectrum LA after the background correction obtained as described above can be expressed by the following four Gaussian functions Y4, Y5, Y6, and Y7 which are obtained by the peak separation. As a result, four spectra of As element present as As$_2$O$_5$ (As$^{5+}$), As element present as As$_2$O$_3$ (As$^{3+}$), As element present as metallic As (metallic As), and As element present as GaAs (As—Ga) can be obtained by the peak separation in a range of binding energy from 39 to 49 eV.

$$Y4 = a4 * \exp\{(-(X - b4)^2)/c4^2\}$$
$$Y5 = a5 * \exp\{(-(X - b5)^2)/c5^2\}$$
$$Y6 = a6 * \exp\{(-(X - b6)^2)/c6^2\}$$
$$Y7 = a7 * \exp\{(-(X - b7)^2)/c7^2\}$$

Gaussian functions Y4, Y5, Y6, and Y7 are expressed in dimensionless units, and in the Gaussian functions Y4, Y5, Y6, and Y7, the X, and the variables b4, b5, b6, b7, c4, c5, c6 and c7 are expressed in units of eV, and the variables a4, a5, a6, and a7 are expressed in dimensionless units.

Gaussian functions Y4 to Y7 are obtained by optimizing the respective variables (a4, a5, a6, a7, b4, b5, b6, b7, c4, c5, c6, and c7) so as to minimize the square of the difference from the actual measurement ([actual measurement value–$\Sigma$Gi]$^2$) on a premise that the i-th component of As3d is represented by Gaussian function Gi=Ai*exp{(–(E–E1)$^2$)/Wi$^2$}. Among the variables, the values of the binding energy at the peaks of signal intensities of As$^{5+}$, As$^{3+}$, metallic As, and As—Ga described above are assigned to b4 to b7, respectively.

In other words, the variables (a4, a5, a6, a7, b4, b5, b6, b7, c4, c5, c6, and c7) are as follows:
a4, a5, a6, and a7 are real numbers of zero or more,
b4=45.57 eV,
b5=44.07 eV,
41.62 eV≤ b6≤42.12 eV,
40.77 eV≤ b7≤41.27 eV,
0.2 eV≤ c4≤0.95 eV,
0.2 eV≤ c5≤0.95 eV,
0.2 eV≤ c6≤0.95 eV, and
0.2 eV≤ c7≤1.2 eV.

Thus, Gaussian functions Y4, Y5, Y6, and Y7 can be expressed, for example, as As5 spectrum L4, As$^{3+}$ spectrum L5, metallic As spectrum L6, and As—Ga spectrum L7, respectively, which are peak separated from As3d spectrum LA in FIG. 1B.

In order to determine the peak positions of Gaussian functions Y1 to Y7, the following correction is performed. First, since the probability of photoelectrons generation by X-rays, which is called photoionization efficiency (n), is variable depending on an element, an X-ray energy, and other factors, data listed on the following Web site is used as a value of the photoionization efficiency n. Specifically, the photoionization efficiency (n) of X-rays having an incident energy of 150 eV is 5.79 for Ga3d and 6.63 for As3d. The photoionization efficiency (n) of X-rays having an incident energy of 600 eV is 0.28 for Ga3d and 0.42 for As3d.

https://vuo.elettra.eu/services/elements/WebElements.html (the references on which the data is based are J. J. Yeh, Atomic Calculation of Photoionization Cross-Sections and Asymmetry Parameters, Gordon and Breach Science Publishers, Langhorne, PE (USA), 1993 and J. J. Yeh and I. Lindau, Atomic Data and Nuclear Data Tables, 32, 1-155 (1985)).

Since an irradiation intensity of X-rays used in the synchrotron radiation facility decays with time, a decay ratio of photoelectron intensity of Au4f is determined by measuring a gold (Au) standard sample at regular time intervals, and an X-ray irradiation dose is corrected based on the ratio.

<Uniformity of Main Surface of GaAs Single-Crystal Substrate>

Characteristics of the GaAs single crystal substrate according to the first embodiment are preferably uniform in a plane of the main surface. In other words, the GaAs single crystal substrate according to the first embodiment preferably enables formation of an epitaxial film with a reduced number of LPDs regardless of an in-plane position on the main surface thereof. A specific embodiment of such a preferred GaAs single crystal substrate include the following embodiment.

That is, the gallium arsenide single crystal substrate has a diameter of 75 mm or more. Furthermore, the GaAs single crystal substrate has a third integrated intensity ratio or a fourth integrated intensity ratio. Each of the third integrated intensity ratio and the fourth integrated intensity ratio is obtained by determining a spectrum of a detected intensity of a 3d electron of each of As and Ga with respect to binding energy of a photoelectron emitted to an outside of the GaAs single crystal substrate based on XPS in which five measurement points on the main surface are irradiated with X-rays under the above condition (i.e., incident X-ray energy of 150 eV and photoelectron take-off angle of) 85°. The third integrated intensity ratio is an average value of the ratio of the sum of the integrated intensity of Ga element ($Ga^+$) present as $Ga_2O$ and the integrated intensity of Ga element ($Ga^{3+}$) present as $Ga_2O_3$ to the integrated intensity of Ga element (Ga—As) present as GaAs and is 13.7 or less. The fourth integrated intensity ratio is an average value of the ratio of the sum of the integrated intensity of Ga element (Ga) present as $Ga_2O$ and the integrated intensity of Ga element ($Ga^{3+}$) present as $Ga_2O_3$ to the sum of the integrated intensity of As element ($As^{5+}$) present as $As_2O_5$ and the integrated intensity of As element ($As^{3+}$) present as $As_2O_3$ and is 1.23 or less. Furthermore, an average value of the number of particles measured at the five measurement points and each having a major axis of 0.16 μm or more is 1.6 or less per cm² of the main surface. In particular, the third integrated intensity ratio is more preferably 4.0 or less, and the fourth integrated intensity ratio is more preferably 0.75 or less. The third integrated intensity ratio is most preferably 2.7 or less, and the fourth integrated intensity ratio is most preferably 0.68 or less.

When the diameter of the gallium arsenide single crystal substrate is represented by D, and two axes passing through the center of the main surface and being orthogonal to each other on the main surface are defined as an X-axis and a Y-axis, coordinates (X, Y) of the five measurement points on the X-axis and the Y-axis are (0, 0), (D/2−15, 0), (0, D/2−15), (−(D/2−15), 0), (0,−(D/2−15)), and the D, and X and Y in the coordinates (X, Y) are expressed in units of mm. On the main surface of the GaAs single crystal substrate having such features, an epitaxial film in which the number of LPDs is further reduced can be formed uniformly in the plane thereof.

With respect to the GaAs single crystal substrate, the specific analysis method of obtaining the third integrated intensity ratio and the fourth integrated intensity ratio is the same as the method described in the above section <Specific Analysis Method of XPS using Synchrotron Radiation> except that the measurement target is changed from the center of the main surface to the five measurement points, and thus redundant description thereof will not be repeated. That is, based on the above method, five third integrated intensity ratios which are ratios of the sum of the integrated intensity of Ga and the integrated intensity of $Ga^{3+}$ to the integrated intensity of Ga—As can be obtained at the above five measurement points. In addition, an average value of the third integrated intensity ratios can be obtained from the five values thereof. Furthermore, five fourth integrated intensity ratios which are ratios of the sum of the integrated intensity of $Ga^+$ and the integrated intensity of $Ga^{3+}$ to the sum of the integrated intensity of $As^{5+}$ and the integrated intensity of $As^{3+}$ can be obtained at the above five measurement points, and an average value of the fourth integrated intensity ratios can be obtained from the five values thereof.

In the GaAs single crystal substrate, the five measurement points are set as follows. That is, the effect of reducing the number of LPDs on the epitaxial film based on the uniform in-plane distributions of the third integrated intensity ratio and the fourth integrated intensity ratio can be evaluated by measuring the number of LPDs generated on the epitaxial film grown in a vicinity region of each of the five measurement points which are set so that distances therebetween are as large as possible. In this evaluation, the number of LPDs is preferably measured in a region having a diameter of 20 mm or more. For this reason, on the main surface of the GaAs single crystal substrate, the positions of five circular measurement regions each having a diameter of 20 mm are set so that distances therebetween are as large as possible. Then, the measurement points are set at the centers of the respective measurement regions.

First, when two axes that pass through the center of the main surface and are orthogonal to each other on the main surface are defined as an X-axis and a Y-axis, coordinates (X, Y) of the first measurement point on the X-axis and the Y-axis among the five measurement points are set to (0, 0). The X-axis and the Y-axis are set such that a notch formed in the GaAs single crystal substrate is located in the third quadrant of an X-Y coordinate plane, and a general angle of a half line passing through the notch with respect to a half line extending from an origin in a positive direction of the X-axis is 225°.

Furthermore, among the five measurement points, the second measurement point, the third measurement point, the fourth measurement point, and the fifth measurement point are arranged at equal intervals on a circumference formed by a set of points located 15 mm inside the outer periphery of the GaAs single crystal substrate. Specifically, coordinates (X, Y) of the second measurement point are set to (D/2−15, 0). Coordinates (X, Y) of the third measurement point is set to (0, D/2−15). Coordinates (X, Y) of the fourth measurement point is set to (−(D/2−15), 0). Coordinates (X, Y) of the fifth measurement point is set to (0,−(D/2−15)).

Figure 3:
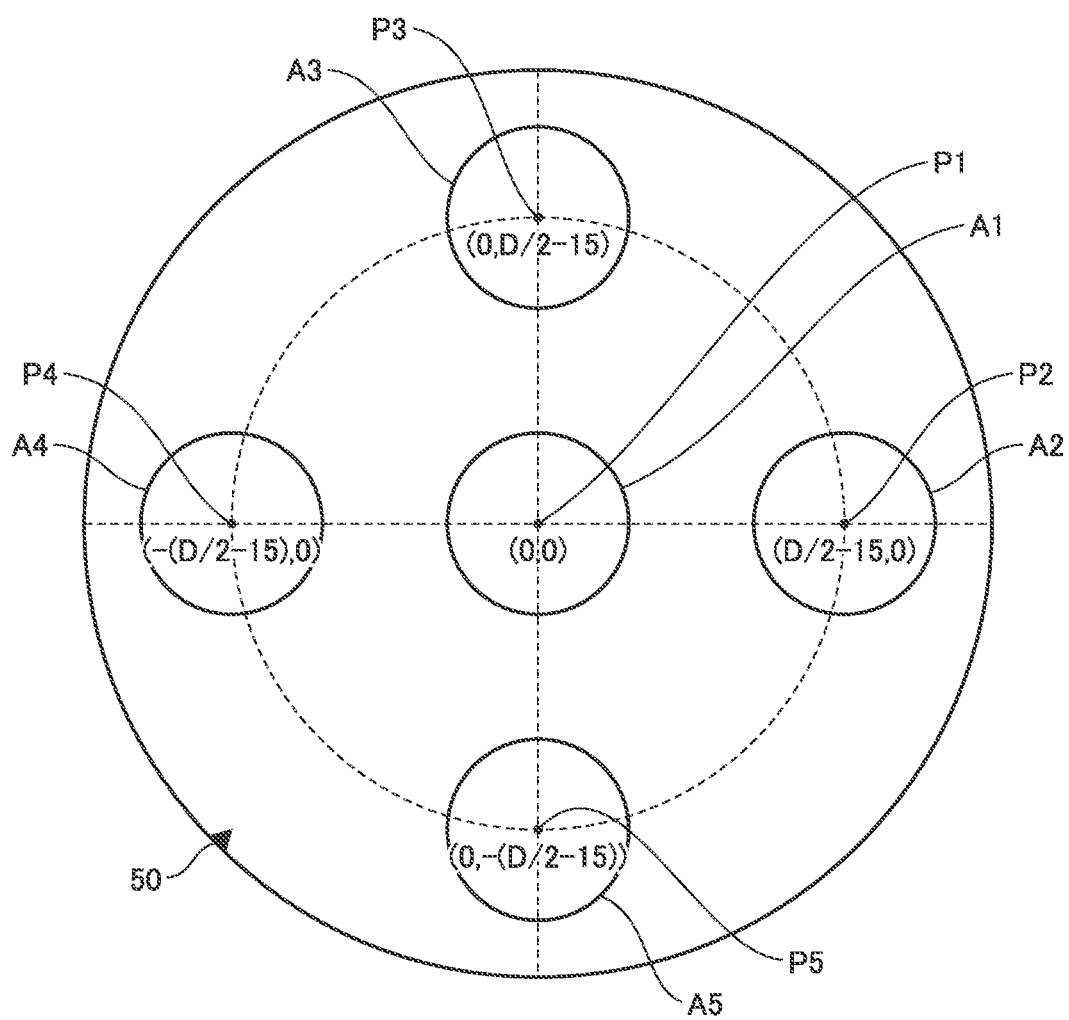
FIG. 3 is an explanatory diagram showing five measurement points set on the main surface for the purpose of evaluating the uniformity of the main surface of the gallium arsenide single crystal substrate in the first embodiment.

FIG. 3 is an explanatory diagram showing the five measurement points set on the main surface for the purpose of evaluating the uniformity of the main surface of the gallium arsenide single crystal substrate in the first embodiment. As shown in FIG. 3, in the GaAs single crystal substrate, the X-axis and the Y-axis are set so that the general angle of the half line passing through a notch 50 with respect to the half-line extending from the origin in the positive direction of the X-axis is 225°. Next, a first measurement point P1 is set at the origin (0, 0) which is the center of the GaAs single crystal substrate, and a measurement region A1 which is a circular region having a diameter of 20 mm and centered at first measurement point P1 is set.

Next, a second measurement point P2, a third measurement point P3, a fourth measurement point P4, and a fifth measurement point P5 are set on the circumference formed by the set of points located 15 mm inside the outer periphery of the GaAs single crystal substrate. Furthermore, a measurement region A2, a measurement region A3, a measurement region A4, and a measurement region A5 which are circular regions each having a diameter of 20 mm and respectively centered at second measurement point P2, third measurement point P3, fourth measurement point P4, and fifth measurement point P5 are set.

For example, when the example shown in FIG. 3 is a GaAs single crystal substrate crystal substrate having a diameter of 100 mm, the coordinates (X, Y) of second measurement point P2, third measurement point P3, fourth measurement point P4, and fifth measurement point P5 are set to (35, 0), (0, 35), (−35, 0) and (0, −35), respectively (where X and Y are expressed in units of mm).

In a further preferred specific embodiment of the GaAs single crystal substrate, an average value of the number of particles each having a major axis of 0.16 μm or more measured at the five measurement points is 1.6 or less per cm² of the main surface. Here, the average value of the number of particles each having a major axis of 0.16 μm or more measured at the five measurement points can be determined by measuring the entire surface of the substrate in accordance with the measurement method described in the section of <Particles each having Major Axis of 0.16 μm or more>, and then analyzing data for circular regions (measurement region A1 to measurement region A5) having a diameter of 20 mm and centered at the five measurement points (first measurement point P1 to fifth measurement point P5).

<Off Angle of GaAs Single Crystal Substrate>

The main surface of the GaAs single crystal substrate according to the first embodiment is preferably a plane having an off angle of 0° to 15° relative to a (100) plane. When the main surface is a plane having an off angle of 0° to 15° relative to the (100) plane, an epitaxial film having excellent electrical and optical characteristics can be formed thereon, and the epitaxial film can be effectively utilized to improve device characteristics.

The off angle of the main surface of the GaAs single crystal substrate relative to the (100) plane can be measured using a conventionally known single crystal orientation measuring apparatus (for example, trade name: "X'Pert PRO MRD", manufactured by Malvern Panalytical Ltd.).

[Gallium Arsenide Single Crystal Substrate: Second Embodiment]

A gallium arsenide single crystal substrate (GaAs single crystal substrate) according to a second embodiment is a GaAs single crystal substrate including a main surface having a circular shape. The GaAs single crystal substrate has a first analytical value or a second analytical value. Each of the first analytical value and the second analytical value is obtained by determining a spectrum of a detected intensity of a 3d electron of each of arsenic (As) and gallium (Ga) with respect to binding energy of a photoelectron emitted to an outside of the GaAs single crystal substrate based on X-ray photoelectron spectroscopy in which a center of the main surface is irradiated with X-rays under each of the following five different conditions and subjecting the spectrum to a maximum smoothness method which is a mathematical analysis method. The first analytical value is a value representing a content of gallium oxides ($Ga_xO$) present as digallium monoxide ($Ga_2O$) and digallium trioxide ($Ga_2O_3$) in a region from the main surface of the GaAs single crystal substrate to a depth of 2 nm and is 0.6 nm or less. The second analytical value is a value representing a ratio of the content of the gallium oxides ($Ga_xO$) to a content of arsenic oxides ($As_xO$) present as diarsenic pentoxide ($As_2O_5$) and diarsenic trioxide ($As_2O_3$) in the region from the main surface of the GaAs single crystal substrate to a depth of 2 nm and is 1.4 or less. The number of particles present on the main surface and each having a major axis of 0.16 μm or more is 2 or less per cm² of the main surface. The five conditions are the following condition 1, condition 2, condition 3, condition 4, and condition 5.

Condition 1: incident X-ray energy of 150 eV, and photoelectron take-off angle of 30°
Condition 2: incident X-ray energy of 150 eV, and photoelectron take-off angle of 45°
Condition 3: incident X-ray energy of 150 eV, and photoelectron take-off angle of 85°
Condition 4: incident X-ray energy of 600 eV, and photoelectron take-off angle of 45°
Condition 5: incident X-ray energy of 600 eV, and photoelectron take-off angle of 85°

In the GaAs single crystal substrate having such features, since the number of particles is small and the oxide film can be effectively removed by thermal cleaning, an epitaxial film having a reduced number of the LPDs can be formed thereon. The first analytical value is obtained by integrating a product of a relative concentration and a minute depth in a depth direction, and is expressed in units of nm. The first analytical value does not include the meaning of a physical length.

The GaAs single crystal substrate according to the second embodiment includes a main surface having a circular shape as described above. In the GaAs single crystal substrate, the number of particles present on the main surface and each having a major axis of 0.16 μm or more is 2 or less per cm² of the main surface. The GaAs single crystal substrate preferably has a diameter of 75 mm to 205 mm. As described above, in the GaAs single crystal substrate according to the second embodiment, the features related to the shape of the main surface, the diameter of the substrate, and the number of particles present on the main surface and each having a major axis of 0.16 μm or more are the same as those in the GaAs single crystal substrate according to the first embodiment, and thus redundant description thereof will not be repeated. The definition of the term "circular shape" of the main surface, the method of measuring the diameter of the substrate, and the method of measuring the number of "particles each having a major axis of 0.16 μm or more" and present on the main surface are also the same as those in the first embodiment, and thus redundant description thereof will not be repeated. Furthermore, since the feature of the off angle of the GaAs single crystal substrate according to the second embodiment are also the same as that of the GaAs single crystal substrate according to the first embodiment, redundant description thereof will not be repeated.

<XPS Using Synchrotron Radiation and Maximum Smoothness Method (MSM Analysis)>

For the GaAs single crystal substrate according to the second embodiment, as shown in the following five conditions (Condition 1 to Condition 5), the state of the main surface can be accurately analyzed by performing XPS using synchrotron radiation under a condition of an incident X-ray energy of 150 eV or 600 eV and a photoelectron take-off angle of 30°, 45°, or 85°.

Condition 1: incident X-ray energy of 150 eV, and photoelectron take-off angle of 30°
Condition 2: incident X-ray energy of 150 eV, and photoelectron take-off angle of 45°
Condition 3: incident X-ray energy of 150 eV, and photoelectron take-off angle of 85°
Condition 4: incident X-ray energy of 600 eV, and photoelectron take-off angle of 45°
Condition 5: incident X-ray energy of 600 eV, and photoelectron take-off angle of 85°

In the second embodiment, under the condition of an incident X-ray energy of 150 eV and a photoelectron take-off angle of 30° (condition 1), a finding related to the state of the main surface of the GaAs single crystal substrate is obtained as an averaged state of a region from the main surface to a depth of about 1 nm. Under the condition of an incident X-ray energy of 150 eV and a photoelectron take-off angle of 45° (condition 2), a finding related to the state of the main surface of the GaAs single crystal substrate is obtained as an averaged state of a region from the main surface to a depth of about 1.5 nm. Under the condition of an incident X-ray energy of 150 eV and a photoelectron take-off angle of 85° (condition 3), a finding related to the state of the main surface of the GaAs single crystal substrate is obtained as an averaged state of a region from the main surface to a depth of about 1.75 nm as described above.

Under the condition of an incident X-ray energy of 600 eV and a photoelectron take-off angle of 45° (condition 4), a finding related to the state of the main surface of the GaAs single crystal substrate is obtained as an averaged state of a region from the main surface to a depth of about 3 nm. Under the condition of an incident X-ray energy of 600 eV and a photoelectron take-off angle of 85° (condition 5), a finding related to the state of the main surface of the GaAs single crystal substrate is obtained as an averaged state of a region from the main surface to a depth of about the 5 nm. As a result, the state of the main surface can be analyzed with an accuracy higher than that in a conventional art.

Furthermore, for the GaAs single crystal substrate according to the second embodiment, a profile (hereinafter also referred to as "depth profile" in the present description) indicating a change in the ratio of each element contained in the GaAs single crystal substrate in a direction from the main surface toward the inside (hereinafter also referred to as "depth direction") can be determined by applying the spectra representing the state of the main surface which are determined by performing the XPS using synchrotron radiation under the five conditions described above to the Maximum Smoothness Method (hereinafter also referred to as "MSM analysis") which is a mathematical analysis method described later. The above elements are Ga element (Ga) present as digallium monoxide $Ga_2O$, Ga element ($Ga^{3+}$) present as digallium trioxide ($Ga_2O_3$), and Ga element (Ga—As) present as gallium arsenide (GaAs), as well as As element ($As^{5+}$) present as diarsenic pentoxide ($As_2O_5$) and As element ($As^{3+}$) present as diarsenic trioxide ($As_2O_3$).

This enables an analysis for a composition distribution in the depth direction of an oxide film with a thickness of about 0.5 to 2 nm formed on the main surface for the GaAs single crystal substrate according to the second embodiment, so that the composition distribution of the oxide film effectively removed by thermal cleaning can be found. In other words, the present inventors have conceived of obtaining a main surface from which the oxide film can be easily removed by thermal cleaning by appropriately controlling the composition distribution of the oxide film.

<First Analytical Value and Second Analytical Value>

Each of the first analytical value and the second analytical value is obtained by determining a spectrum of a detected intensity of a 3d electron of each of As and Ga with respect to binding energy of a photoelectron emitted to an outside of the GaAs single crystal substrate based on XPS in which a center of the main surface is irradiated with X-rays under each of the five conditions and subjecting the spectrum to the MSM analysis.

The first analytical value is a value representing a content of gallium oxides ($Ga_xO$) present as digallium monoxide ($Ga_2O$) and digallium trioxide ($Ga_2O_3$) in a region from the main surface of the GaAs single crystal substrate to a depth of 2 nm and is 0.6 nm or less. The second analytical value is a value representing a ratio of the content of the gallium oxides ($Ga_xO$) to a content of arsenic oxides ($As_xO$) present as diarsenic pentoxide ($As_2O_5$) and diarsenic trioxide ($As_2O_3$) in the region of the GaAs single crystal substrate to a depth of 2 nm and is 1.4 or less.

The first analytical value of 0.6 nm or less means that the content of the gallium oxides ($Ga_xO$: $Ga_2O$ and $Ga_2O_3$) is low in the composition distribution of the oxide film having a thickness of 0.5 to 2 nm in the direction from the main surface toward the inside (depth direction). The second analytical value of 1.4 or less means that, in the composition distribution of the oxide film having a thickness of 0.5 to 2 nm in the depth direction, the content of the gallium oxides ($Ga_xO$) is substantially equal to or less than that of arsenic oxides ($As_xO$). In these cases, it is considered that the oxide film is effectively removed by thermal cleaning because a separation temperature thereof becomes lower due to a lower content of the gallium oxides ($Ga_xO$). In particular, the first analytical value is preferably 0.48 nm or less, and the second analytical value is preferably 1.2 or less. The first analytical value is more preferably 0.32 nm or less, and the second analytical value is more preferably 0.94 or less.

On the other hand, in a conventional GaAs single crystal substrate, the first analytical value exceeds 0.6 nm, or the second analytical value exceeds 1.4. In such a GaAs single crystal substrate, since the relative content of the gallium oxides is higher in the composition distribution of the oxide film, the oxide film may remain on the main surface even after thermal cleaning. Therefore, when an epitaxial film is formed on the main surface of the GaAs single crystal substrate after the thermal cleaning, there is a likelihood that a growth failure occurs and thus the number of LPDs increases.

Figure 4:
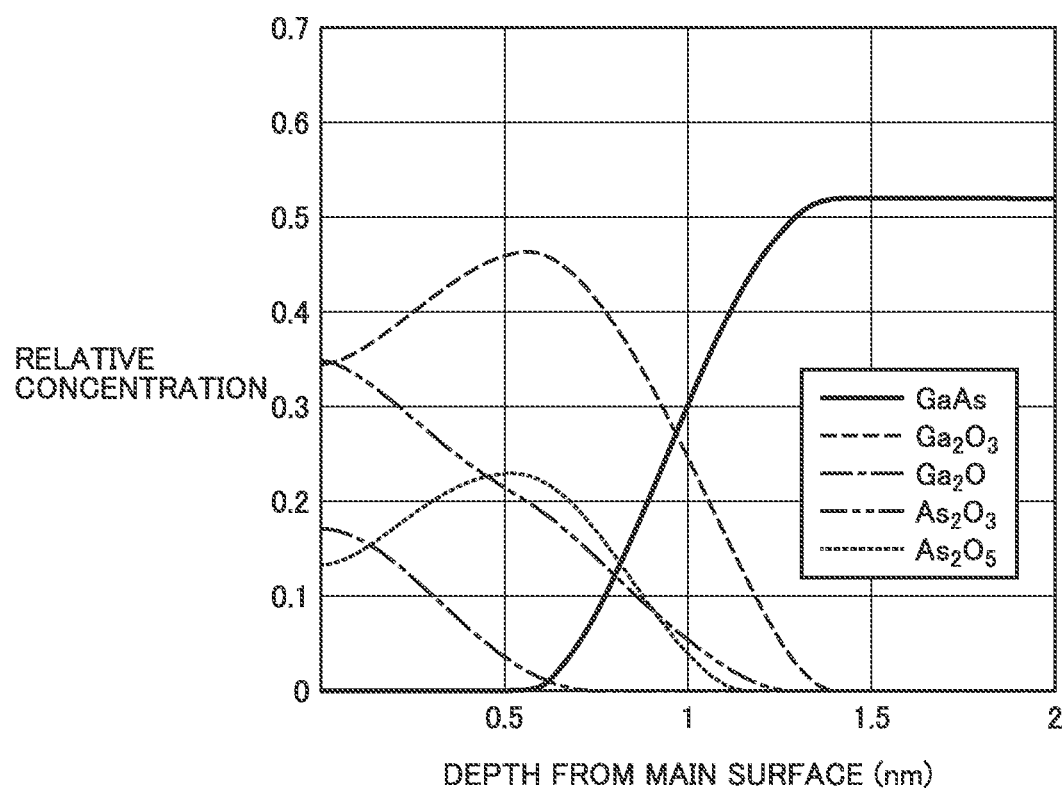
FIG. 4 is a graph showing an example of depth profiles showing relative concentrations (vertical axis) of diarsenic pentoxide, diarsenic trioxide, digallium monoxide, digallium trioxide, and gallium arsenide versus a depth (nm) from the main surface (horizontal axis) in a gallium arsenide single crystal substrate according to a second embodiment.

FIG. 4 is a graph showing an example of a depth profile showing a relative concentration (vertical axis) of diarsenic pentoxide, diarsenic trioxide, digallium monoxide, digallium trioxide, and gallium arsenide versus a depth (nm) from the main surface (horizontal axis) in the gallium arsenide single crystal substrate according to the second embodiment.

In other words, FIG. 4 shows an example of the depth profile indicating a change in a ratio of each element contained in the GaAs single crystal substrate in the depth direction of the main surface.

According to FIG. 4, relative concentrations of $Ga_2O_3$ and $As_2O_5$ reach maximums at a depth position exceeding 0.5 nm from the main surface and then the relative concentrations decrease as the depth from the main surface further increases. The relative concentrations of $Ga_2O$ and $As_2O_3$ reach maximums near the main surface, and then the relative concentrations decrease as the depth from the main surface further increases. On the other hand, GaAs becomes detectable at a depth position exceeding 0.5 nm from the main surface, and the relative concentration of GaAs increases as the depth from the main surface further increases. Furthermore, the relative concentration of GaAs reaches a maximum at a depth position of about 1.5 nm from the main surface and becomes constant at about 0.5 at deeper positions (in FIG. 4, since the relative concentration of GaAs is expressed based on the spectrum of the detected intensity of 3d electron of Ga, the relative concentration becomes constant at about 0.5. Since a profile of the relative concentration of GaAs based on the spectrum of the detected intensity of 3d electron of As is the same as that shown in FIG. 4, the profile is not shown).

In FIG. 4, the sum of an area of a region surrounded by the curve representing the relative concentration of $Ga_2O_3$ and the horizontal axis (X-axis) and an area of a region surrounded by the curve representing the relative concentration of $Ga_2O$ and the horizontal axis (X-axis) represents the content of $Ga_xO$ ($Ga_2O$ and $Ga_2O_3$) in the region from the main surface of the GaAs single crystal substrate to a depth of 2 nm, and thus corresponds to the first analytical value. In addition, the ratio of the sum of the area of the region surrounded by the curve representing the relative concentration of $Ga_2O_3$ and the horizontal axis (X-axis) and the area of the region surrounded by the curve representing the relative concentration of $Ga_2O$ and the horizontal axis (X-axis) to the sum of an area of a region surrounded by the curve representing the relative concentration of $As_2O_3$ and the horizontal axis (X-axis) and an area of a region surrounded by the curve representing the relative concentration of $As_2O_5$ and the horizontal axis (X-axis) represents the ratio of the content of $Ga_xO$ to the content of $As_xO$ ($As_2O_5$ and $As_2O_3$) in the region from the main surface of the GaAs single crystal substrate to a depth of 2 nm, and thus corresponds to the second analytical value. Hereinafter, a specific method of an XPS analysis using synchrotron radiation and the MSM analysis for obtaining the first analytical value and the second analytical value will be specifically described.

<Specific Analysis Method of XPS Using Synchrotron Radiation>

The specific analysis method of XPS using synchrotron radiation for the GaAs single crystal substrate according to the second embodiment is the same as the method described in the section of <Specific Analysis Method of XPS using Synchrotron Radiation> for the GaAs single crystal substrate according to the first embodiment described above except that the conditions for performing XPS using synchrotron radiation are five conditions (the above conditions 1 to 5) including the condition of an incident X-ray energy of 150 eV and a photoelectron take-off angle of 85°, and thus redundant description thereof will not be repeated. In other words, for the GaAs single crystal substrate according to the second embodiment, by performing XPS using synchrotron radiation under the above-described five conditions (conditions 1 to 5), five Ga3d spectra and five As3d spectra corresponding to the conditions 1 to 5 can be obtained.

With respect to the specific analysis method of XPS using synchrotron radiation, in an analysis system for the GaAs single crystal substrate according to the second embodiment, angle $\theta_1$ between a traveling direction of X-rays incident on GaAs single crystal substrate 1 from X-ray generator 10 and main surface 1m of GaAs single crystal substrate 1 is set to 60°, 45°, or 5°, for example, and take-off angle $\theta_2$ is set to 30°, 45°, or 85°.

Depth d (nm) from the main surface to be analyzed in the GaAs single crystal substrate according to the second embodiment can be determined by using take-off angles $\theta_2$ under the conditions 1 to 5 and the above-described equations. Depth d (nm) from the main surface to be analyzed is as follows. Under the condition of an incident X-ray energy of 150 eV and a photoelectron take-off angle of 30° (condition 1), depth d is about 1 nm. Under the condition of an incident X-ray energy of 150 eV and a photoelectron take-off angle of 45° (condition 2), depth d is about 1.5 nm. Under the condition of an incident X-ray energy of 150 eV and a photoelectron take-off angle of 85° (condition 3), depth d is about 1.75 nm. Under the condition of an incident X-ray energy of 600 eV and a photoelectron take-off angle of 45° (condition 4), depth d is about 3 nm. Under the condition of an incident X-ray energy of 600 eV and a photoelectron take-off angle of 85° (condition 5), depth d is about 5 nm.

<Maximum Smoothness Method (MSM Analysis)>
(Method of Calculating First Analytical Value and Second Analytical Value)

As described above, each of the first analytical value and the second analytical value is obtained by determining a spectrum of a detected intensity of a 3d electron of each of As and Ga with respect to binding energy of a photoelectron emitted to an outside of the GaAs single crystal substrate based on XPS in which a center of the main surface is irradiated with X-rays under each of the five conditions and subjecting the spectrum to an MSM analysis. Therefore, in order to calculate the first analytical value and the second analytical value, each of five Ga3d spectra and five As3d spectra determined under the above conditions 1 to 5 is applied to the MSM analysis. As a result, the depth profiles representing the relative concentrations (vertical axis) of $As_2O_5$, $As_2O_3$, $Ga_2O$, $Ga_2O_3$, and GaAs in the GaAs single crystal substrate versus the depth (horizontal axis) from the main surface can be created by the MSM analysis, as shown in FIG. 4, and thus the first analytical value and the second analytical value can be obtained from the depth profiles. The MSM analysis will be described below.

The details of the MSM analysis are described in, for example, an article published in 2021 (Y. Hoshina et al., "Non-destructive initial-profile-free depth profile evaluation of thin-film sample using angle-resolved X-ray photoelectron spectroscopy and profile smoothing regularization", Japanese Journal of Applied Physics, Vol. 60, 101003 (2021)) and an article published in 2022 (Hoshina et al., "Maximum Smoothness Method for Nondestructive XPS Depth Analysis", Sumitomo Electric Technical Review, No. 200, January 2022, pp. 102-107).

1. Theoretical Formula for Data Related to Ga3d Spectrum and As3d Spectrum

Figure 5:
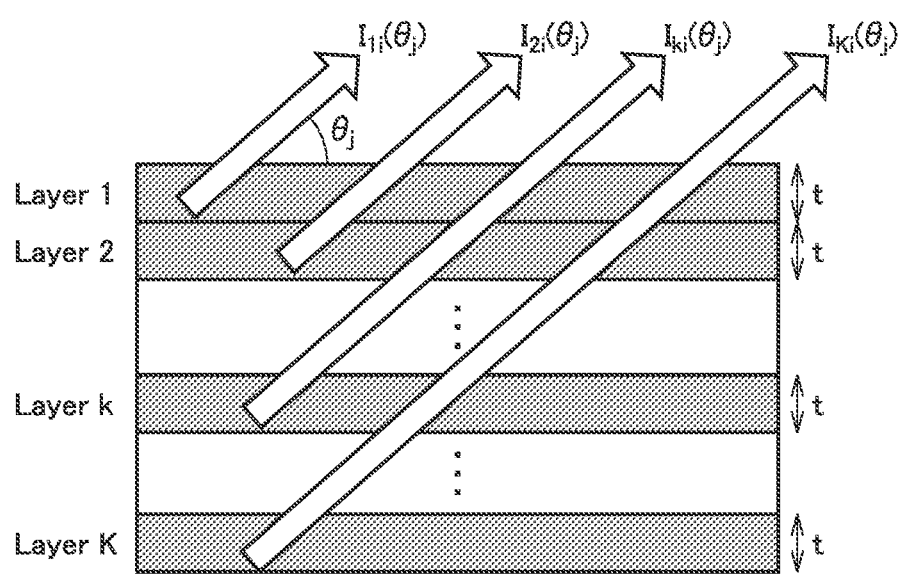
FIG. 5 is a schematic diagram showing a relationship between an incident X-ray and a photoelectron signal generated from each of layers in a gallium arsenide single crystal substrate in X-ray photoelectron spectroscopy using synchrotron radiation.

In order to perform the MSM analysis, first, a theoretical formula is necessary for connecting the five Ga3d spectra and the five As3d spectra determined under the conditions 1 to 5 to the depth profiles FIG. 5 is a schematic diagram showing a relationship between an incident X-ray and a photoelectron signal generated from each of layers in a gallium arsenide single crystal substrate in X-ray photoelectron spectroscopy using synchrotron radiation. As shown in FIG. 5, the main surface and the region inward from the main surface in the GaAs single crystal substrate are considered to be a stack including K thin layers. Each of the layers has a thickness t.

Hereinafter, a case is considered in which XPS is performed on the GaAs single crystal substrate using synchrotron radiation under a condition of a take-off angle $\theta_j$. Take-off angle $\theta_j$ is set to J levels in total. In this case, a photoelectron signal $I_{ki}(\theta_j)$ relating to a chemical species i, which is generated in the k-th layer and reaches a sample surface, is expressed by the following Equation (1), where the number of chemical species i is I in total.

$$I_{1i}(\theta_j) = c_{1i}\sigma_i t \quad (1)$$

$$I_{2i}(\theta_j) = c_{2i}\sigma_i t \exp\left(-\frac{t}{\lambda_{1i}\sin\theta_j}\right)$$

$$\vdots$$

$$I_{ki}(\theta_j) = c_{ki}\sigma_i t \exp\left(-\frac{t}{\lambda_{1i}\sin\theta_j}\right) \cdots \exp\left(-\frac{t}{\lambda_{k-1,i}\sin\theta_j}\right)$$

$$\vdots$$

$$I_{Ki}(\theta_j) = c_{Ki}\sigma_i t \exp\left(-\frac{t}{\lambda_{1i}\sin\theta_j}\right) \cdots \exp\left(-\frac{t}{\lambda_{K-1,i}\sin\theta_j}\right)$$

i.e., $$I_{ki}(\theta_j) = c_{ik}\sigma_i t \prod_{l=1}^{k-1} \exp\left(-\frac{t}{\lambda_{li}\sin\theta_j}\right)$$

In the above Equation (1), $c_{ik}$ represents a relative concentration of the chemical species i in the k-th layer. The total of the relative concentrations of chemical species i is one ($\Sigma_i c_{ik}=1$). $\lambda_{li}$ represents an inelastic mean free path of a photoelectron generated from chemical species i in the first layer. $\sigma_i$ represents a relative ionization cross-section of the photoelectron of chemical species i with respect to X-rays. Regarding a signal in a case of k=1, that is, the signal of the outermost surface layer, a total power $\Pi$ is considered to be one.

Here, thickness t of the layer is regarded as being very small compared to inelastic mean free path $\lambda_{li}$ (t<<$\lambda_{li}$). Therefore, in Equation (1), a decay of a photoelectron in a layer in which the photoelectron is generated can be approximated by a linear function (because when x<<1, $e^{-x}$ to 1−x).

In the XPS using synchrotron radiation described above, the total of the signals generated from the K layers is observed. Therefore, a theoretical value $d'_{ij}$ of a signal intensity at take-off angle $\theta_j$ for chemical species i is expressed by the following Equation (2)

$$d'_{ij} = \sum_{k=1}^{K} I_{ki}(\theta_j) \quad (2)$$

Summarizing the above Equations (1) and (2), the relationship between the relative concentration and the XPS theoretical intensity can be expressed by a matrix S, a vector d', and a vector c, as shown in the following Equation (3).

$$d' = Sc \quad (3)$$

Vector d' and vector c are expressed by Equations (4) and (5), respectively.

$$d' = {}^T(d'_{11}, \ldots, d'_{1J}, d'_{21}, \ldots, d'_{2J}, \ldots, d'_{I1}, \ldots, d'_{IJ}) \quad (4)$$

$$c = {}^T(c_{11}, \ldots, c_{1K}, c_{21}, \ldots, c_{2K}, \ldots, c_{I1}, \ldots, c_{IK}) \quad (5)$$

As shown in the above Equation (4), vector d' is a (I×J) row vector in which XPS theoretical intensities of all chemical species and all angles are arranged in a single column. As shown in Equation (5) above, a vector c is a (I×K) row vector in which relative concentrations of all chemical species and all depths are arranged in a single column. Matrix S is a (I×J)-by-(I×K) matrix expressed by the following Equation (6). Hereinafter, I x J is denoted by "IJ", and I×K is denoted by "IK".

$$S = \begin{pmatrix} S^{(1)} & \cdots & 0 \\ \vdots & \ddots & \vdots \\ 0 & \cdots & S^{(I)} \end{pmatrix} \quad S^{(i)} = \begin{pmatrix} r_1 s_{11}^{(i)} & \cdots & r_1 s_{1K}^{(i)} \\ \vdots & \ddots & \vdots \\ r_J s_{J1}^{(i)} & \cdots & r_J s_{JK}^{(i)} \end{pmatrix} \quad (6)$$

$s^{(i)}_{jk}$ is expressed in accordance with Equation (7).

$$s^{(i)}_{jk} = \sigma_i t \prod_{l=1}^{k-1} \exp\left(-\frac{t}{\lambda_{li}\sin\theta_j}\right) \quad (7)$$

Here, a constant $r_{ij}$ does not appear in the above Equations (1) and (2). Constant $r_{ij}$ is an important element in the MSM analysis and thus will be described in detail later.

In the MSM analysis, a sum of squared deviations between theoretical values and actual measurement data obtained by performing XPS using synchrotron radiation is used as an index for depth profile evaluation. When the measurement data is expressed by vector d (the component is $d_{ij}$) in accordance with the above Equation (4), the sum of squared deviations is expressed in accordance with Equation (8). In Equation (8), the constant 1/2 is provided for convenience of notation.

$$\frac{1}{2}\sum_{i=1}^{I}\sum_{j=1}^{J}(d_{ij} - d'_{ij})^2 = \frac{1}{2}c^T(S^T S)c - d^T Sc + \frac{1}{2}d^T d \quad (8)$$

2. Problem Regarding Determination of Depth Profile

By minimizing Equation (8) using IK relative concentrations $c_{ik}$ as variables, a depth profile that best reproduces the measurement data can be obtained. However, minimizing the above Equation (8) is mathematically very unstable.

The above Equations (1) and (2) mean that the intensity of a photoelectron signal generated in XPS using synchrotron radiation is the sum of photoelectron signals generated from the respective layers of the GaAs single crystal substrate, that is, a weighted average value. Measurement data to be fitted for IK relative concentrations $c_{ik}$ to be determined are only I depth-direction weighted average values. For this reason, multiple profiles that significantly differ from one another are candidates for the solution to the minimization problem of Equation (8). This means that the solution may differ significantly even if the variation in the measurement data is slight (the solution becomes unstable).

The estimation of IK relative concentrations $c_{ik}$ from the measurement data obtained by performing XPS using synchrotron radiation corresponds to the so-called inverse problem. According to Jacques Salomon Hadamard, generally, a well-posed problem is defined as satisfying all three requirements: (1) existence of solution, (2) uniqueness of solution, and (3) continuity or stability of solution. A problem in which even one of these requirements is missing falls in an ill-posed problem.

The fact that the solution of the minimization problem of Equation (8) is not uniquely determined corresponds to the "ill-posed problem" in the sense of Hadamard. In order to obtain a depth profile that best reproduces the measurement data, a constraint is required to select one solution from among myriad candidate solutions for the minimization problem of Equation (8) above.

There is some reasonable idea (in other words, "general common knowledge") for the system shown in FIG. 5. Therefore, by expressing the "general common knowledge" in a mathematical expression and minimizing an equation obtained by adding the mathematical expression to Equation (8), it is possible to impose the constraint on the myriad candidate solutions.

3. Maximum Entropy Method and Problem Thereof

A conventional maximum entropy method (hereinafter also referred to as "MEM analysis") requires "the entropy of a system is maximum" as the "general common knowledge". For optimization of IK relative concentrations $c_{ik}$, a quantity expressed by following Equation (9) is considered. Equation (9) represents a relative entropy of relative concentration $c_{ik}^{(0)}$ with respect to relative concentration $c_{ik}$ (where $c_{ik}^{(0)}$ represents an initial value of relative concentration).

$$-\sum_{i=1}^{I}\sum_{k=1}^{K} c_{ik}\log\left(\frac{c_{ik}}{c_{ik}^{(0)}}\right) \quad (9)$$

The above Equation (9) can be interpreted as "the similarity of relative concentration $c_{ik}$ to relative concentration $c_{ik}^{(0)}$" or "the amount of information obtained by the analysis when the estimated state of the relative concentration is changed from $c_{ik}^{(0)}$ to $c_{ik}$ by performing XPS using synchrotron radiation"

Maximizing the relative entropy expressed by the above Equation (9) results in "searching for optimum relative concentration $c_{ik}$ in a range close to the initial value $c_{ik}^{(0)}$ of the relative concentration". Thus, the determination of the initial value $c_{ik}^{(0)}$ directly affects the determination of the relative concentration $c_{ik}$. However, for example, when XPS is performed because an unknown failure mode has occurred in a semiconductor device, there is a possibility that the initial value $c_{ik}^{(0)}$ of the relative concentration cannot be estimated for a sample to be analyzed. In this case, it may be difficult to obtain an accurate evaluation result in the MEM analysis.

4. Maximum Smoothness Method (MSM Analysis)

A new method alternative to the above MEM analysis is referred to as the maximum smoothness method (MSM analysis) as described above in the present description. Hereinafter, application of data obtained by XPS to MSM analysis will be specifically described.

Minimization of a quantity expressed by the following Equation (10) is considered.

$$\frac{1}{2}\sum_{i=1}^{I}\sum_{k=1}^{K-1}(c_{ik+1}-c_{ik})^2 = \frac{1}{2}c^T Q_S c \quad (10)$$

Here, $Q_s$ is an IK-by-IK matrix expressed by Equation (11).

$$Q_S = \begin{pmatrix} Q_S^{(1)} & \cdots & 0 \\ \vdots & \ddots & \vdots \\ 0 & \cdots & Q_S^{(I)} \end{pmatrix} \quad Q_S^{(i)} = \begin{pmatrix} 1 & -1 & 0 & & & \\ -1 & 2 & -1 & \cdots & & 0 \\ 0 & -1 & 2 & & & \\ \vdots & & & \ddots & & \vdots \\ & & & & 2 & -1 & 0 \\ & 0 & & \cdots & -1 & 2 & -1 \\ & & & & 0 & -1 & 1 \end{pmatrix} \quad (11)$$

Equation (10) represents a sum of squared differences in relative concentrations between two adjacent layers. A small sum of the squares means a smooth change in relative concentration between the layers. That is, in the MSM analysis, the constraint that the depth profile is smooth for each chemical species is added to Equation (8) above.

The basic idea of the MSM analysis is expressed by Equation (10). In order to obtain a more plausible solution, the "charge neutral condition" is considered as a further general common knowledge. This is because there is a likelihood that a layer that cannot be present in an actual sample will appear in the depth profile when only Equation (8) and Equation (10) are used for minimization. In order to avoid such a problem and obtain a plausible solution, minimization of a quantity expressed by the following Equation (12) is considered. In Equation (12), $e_i$ represents a constant that constrains an abundance ratio of chemical species i.

$$\frac{1}{2}\sum_{k=1}^{K}[e_1 c_{1k}+e_2 c_{2k}+\ldots+e_I c_{Ik}]^2 = \frac{1}{2}c^T Q_{EN} c \quad (12)$$

Here, $Q_{EN}$ is an IK-by-IK matrix represented by the following Equation (13). In addition, E in Equation (13) is a K-by-K unit matrix.

$$Q_{EN} = \begin{pmatrix} e_1 e_1 E & e_1 e_2 E & & e_1 e_I E \\ e_2 e_1 E & e_2 e_2 E & \cdots & e_2 e_I E \\ \vdots & \vdots & & \vdots \\ e_I e_1 E & e_I e_2 E & & e_I e_I E \end{pmatrix} \quad (13)$$

For example, when it is reasonable from general common knowledge that chemical species i' and chemical species i" are present in a sample at a ratio of 1:3, $e_{i'}$ and $e_{i''}$ are set to 3 and −1 in the above Equation (12), respectively, and the other $e_i$ is set to zero. The signs of $e_{i'}$ and $e_{i''}$ may be opposite to those described above.

In other words, Equation (12) in this case means that a penalty is imposed on a deviation in the concentration ratio between chemical species i' and chemical species i" from 1:3 in all of the K layers.

The sum of Equation (8), Equation (10) and Equation (12) is expressed by Equation (14). In the MSM analysis, vector c in Equation (14) is minimized as a variable. Since $1/2 d^T d$ in Equation (8) is a constant term that does not depend on vector c, it can be ignored in the following discussion.

$$\frac{1}{2}c^T(S^TS)c - d^TSc + \frac{\lambda}{2}c^TQ_Sc + \frac{\lambda_{EN}}{2}c^TQ_{EN}c \quad (14)$$

Parameters $\lambda$ and $\lambda_{EN}$ represent how strongly the profile is required to be smooth and charge neutral, respectively, compared to the sum of squared deviations. Depending on these parameters $\lambda$ and $\lambda_{EN}$, the degree of smoothness and charge neutrality of the resulting solution will vary. Since there is no absolutely correct solution, the parameters are adjusted so as to obtain a plausible solution.

The minimization of Equation (14) corresponds to a quadratic programming problem. Furthermore, coefficients matrices $S^TS$, $Q_S$, and $Q_{EN}$ of the second order terms are all positive semidefinite matrices. Thus, the minimization of Equation (14) corresponds not to a simple quadratic programming problem but to a convex quadratic programming problem in which a globally optimum solution (a solution guaranteed to be the best in the entire feasible region) is obtained.

The MSM analysis is a method that overcomes the problem of "the need for inputting an initial value" which is a weak point of the conventional MEM analysis. In particular, the MSM analysis completely eliminates the need for an initial profile by dropping the determination of the depth profile to the convex quadratic programming problem.

5. Simplified Method of Treating Relative Concentration

In general, it is difficult to treat an absolute value of a signal intensity and an absolute concentration of a chemical species generated in XPS. For this reason, it is common to treat only relative values for both the signal intensity and the concentration of the chemical species. Therefore, when theoretical value d' of the signal intensity generated by XPS is compared with the measurement data in the calculation of Equation (8), it is necessary to convert theoretical value d' into a relative value.

From Equation (3), theoretical value d' is linear with respect to relative concentration c. However, a value obtained by dividing each component of d' by the total of the components of d' to convert theoretical value d' into a relative value is non-linear with respect to relative concentration c. Therefore, the optimization problem of Equation (14) is beyond the scope of the convex quadratic programming problem.

In order to solve this problem, a constant $r_j$ is used in the MSM analysis as expressed in Equation (6). Constant $r_j$ is a distinct value for each angle j and can be regarded as an "apparatus constant" reflecting an unknown factor such as an absolute sensitivity of the apparatus. In other words, constant $r_j$ can be regarded as a parameter for hypothetically determining theoretical value d' of the signal intensity as an absolute value from relative concentration c. The value of constant $r_j$ is unknown, but can be optimized in parallel with the minimization of Equation (14).

A provisional value of constant $r_j$ is considered to be obtained at a certain point in the analysis. Multiplying each constant $r_j$ by distinct constant $r'_j$ to "update" each constant $r_j$ is considered. The policy for updating constant $r_j$ is unambiguous and minimizes Equation (8) above. This means that apparatus constant $r_j$ is optimized to derive the most theoretical value close to the measurement data.

Partial matrix $S^{(i)}$ of matrix S expressed in Equation (6) is expressed by the following Equation (15).

$$S^{(i)} = \begin{pmatrix} r'_1r_1s_{11}^{(i)} & r'_1r_1s_{12}^{(i)} & & r'_1r_1s_{1K}^{(i)} \\ r'_2r_2s_{21}^{(i)} & r'_2r_2s_{22}^{(i)} & \cdots & r'_2r_2s_{2K}^{(i)} \\ \vdots & \vdots & & \vdots \\ r'_Jr_Js_{J1}^{(i)} & r'_Jr_Js_{J2}^{(i)} & & r'_Jr_Js_{JK}^{(i)} \end{pmatrix} \quad (15)$$

Each constant $r_j$ contributes only to components of angle j of experimental and theoretical values. Therefore, the result of partial differentiation of the sum of squared deviations in the above Equation (8) by $r'_j$ is zero. As a result, an updated equation expressed by Equation (16) can be obtained.

$$r'_j = \frac{\sum_{i=1}^I d_{ij}d'_{ij}}{\sum_{i=1}^I {d'_{ij}}^2} \quad (16)$$

The simultaneous optimization of relative concentration c and constant $r_j$ is beyond the scope of the convex quadratic programming, and becomes a problem requiring an initial value. However, in the MSM analysis, the optimization of Equation (14) and the update of the Equation (16) are alternately performed. The optimization of the above Equation (14) is the convex quadratic programming problem, and the update of the above Equation (16) is four simple arithmetic operations. Therefore, the construction of the depth profile becomes a problem that requires no initial value.

6. Process of Performing MSM Analysis

In summary, the MSM analysis is performed with the steps described below.

(1) Measurement data (for example, XPS measurement data) are acquired, and the data are converted to relative values.
(2) $\sigma_i$ (relative ionization cross-sectional area) in Equation (1) is set.
(3) Charge neutral condition in Equation (12) is set.
(4) Values of parameters $\lambda$ and $\lambda_{EN}$ in Equation (14) are set.
(5) $r_j$ is updated by Equation (16) with constant $r_j$ set to be one, and an initial value is determined.
(6) Optimization of Equation (14) (optimization in the convex quadratic programming) and update of constant $r_j$ by Equation (16) are repeated until the result converges.

When $\sigma_i$ is multiplied by a constant for all chemical species in step (2) above, the effect of multiplying $\sigma_i$ by the constant is cancelled in the first update of $r_j$ in step (5). In other words, as for $\sigma_i$, only an exact relative value needs to be entered, and it is not necessary to enter an absolute value which is generally difficult to know in detail.

7. Analysis Apparatus and Analysis Method

As described above, in the MSM analysis, by performing the above-described steps (1) to (6) on a known computer, depth profiles as shown in FIG. 4, for example, can be created from the measurement data for the main surface of the GaAs single crystal substrate. Referring to FIG. 4, the sum of the area of the region surrounded by the curve representing the relative concentration of $Ga_2O_3$ appearing in the depth profile and the horizontal axis (X-axis) and the area of the region surrounded by the curve representing the relative concentration of $Ga_2O$ and the horizontal axis (X-axis) represents the content of $Ga_xO$ ($Ga_2O$ and $Ga_2O_3$) in the region from the main surface of the GaAs single crystal substrate to a depth of 2 nm, and thus corresponds to the first analytical value. In addition, the ratio of the sum of the area of the region surrounded by the curve representing the relative concentration of $Ga_2O_3$ and the horizontal axis (X-axis) and the area of the region surrounded by the curve representing the relative concentration of $Ga_2O$ and the horizontal axis (X-axis) to the sum of the area of the region surrounded by the curve representing the relative concentration of $As_2O_3$ and the horizontal axis (X-axis) and the area of the region surrounded by the curve representing the relative concentration of $As_2O_5$ and the horizontal axis (X-axis) represents the ratio of the content of $Ga_XO$ to the content of $As_XO$ ($As_2O_5$ and $As_2O_3$) in the region from the main surface of the GaAs single crystal substrate to a depth of 2 nm, and thus corresponds to the second analytical value. As described above, the first analytical value and the second analytical value can be obtained from five Ga3d spectra and five As3d spectra determined under the conditions 1 to 5 by applying these spectra to the MSM analysis.

<Uniformity of Main Surface of GaAs Single Crystal Substrate>

Characteristics of the GaAs single crystal substrate according to the second embodiment are preferably uniform in the plane of the main surface. In other words, the GaAs single crystal substrate according to the second embodiment preferably enables formation of an epitaxial film with a reduced number of LPDs regardless of an in-plane position of on the main surface thereof. A specific embodiment of such a preferred GaAs single crystal substrate includes the following embodiment.

That is, the GaAs single crystal substrate has a diameter 75 mm or more. The GaAs single crystal substrate has a third analytical value or a fourth analytical value. Each of the third analytical value and the fourth analytical value is obtained by determining a spectrum of a detected intensity of a 3d electron of each of As and Ga with respect to binding energy of a photoelectron emitted to an outside of the GaAs single crystal substrate based on XPS in which five measurement points on the main surface are irradiated with X-rays under each of the five conditions (i.e., conditions 1 to 5) and subjecting the spectrum to the MSM analysis. The third analytical value is a value representing an average value of the content of gallium oxides ($Ga_XO$) present as the digallium monoxide ($Ga_2O$) and the digallium trioxide ($Ga_2O_3$) in a region from the main surface of the GaAs single crystal substrate to a depth of 2 nm and is 0.57 nm or less. The fourth analytical value is a value representing an average value of the ratio of the content of the gallium oxides ($Ga_XO$) to the content of the arsenic oxides ($As_XO$) present as the diarsenic pentoxide ($As_2O_5$) and the diarsenic trioxide ($As_2O_3$) in the region from the main surface of the GaAs single crystal substrate to a depth of 2 nm and is 1.37 or less. Furthermore, an average value of the number of particles measured at the five measurement points and each having a major axis of 0.16 μm or more is 1.6 or less per cm² of the main surface. In particular, the third analytical value is preferably 0.37 nm or less, and the fourth analytical value is more preferably 1.06 or less. Most preferably, the third analytical value is 0.34 nm or less, and most preferably, the fourth analytical value is 1.00 or less. The third analytical value is obtained by integrating a product of a relative concentration and a minute depth in the depth direction, and is expressed in units of nm. The third analytical value does not include the meaning of a physical length.

When the diameter of the gallium arsenide single crystal substrate is represented by D and two axes passing through the center of the main surface and being orthogonal to each other on the main surface are defined as an X-axis and a Y-axis, coordinates (X, Y) of the five measurement points on the X-axis and Y-axis are (0, 0), (D/2−15, 0), (0, D/2−15), (−(D/2−15), 0), (0,−(D/2−15)). The D, and X and Y in the coordinates (X, Y) are expressed in units of mm. On the main surface of the GaAs single crystal substrate having such features, an epitaxial film in which the number of LPDs is further reduced can be formed uniformly in the plane thereof.

With respect to the GaAs single crystal substrate, the specific analysis method of obtaining the third analytical value and the fourth analytical value is the same as the method described in the sections of <Specific Analysis Method of XPS using Synchrotron Radiation> and <Maximum Smoothness Method (MSM Analysis)> for obtaining the first analytical value and the second analytical value except that the measurement target is changed from the center of the main surface to the five measurement points, and thus redundant description thereof will not be repeated. That is, based on the above method, five contents of $Ga_XO$ in the region from the main surface to a depth of 2 nm are determined at the five measurement points, and then the third analytical value can be obtained as an average value of the five contents of $Ga_XO$. Furthermore, five ratios of the content of $Ga_XO$ to the content of $As_XO$ in the region from the main surface to a depth of 2 nm are determined at the five measurement points, and the fourth analytical value can be obtained as an average value of the five ratios. The method of setting the five measurement points in the GaAs single crystal substrate according to the second embodiment is the same as the method of setting the five measurement points in the GaAs single crystal substrate according to the first embodiment, and thus redundant description thereof will not be repeated.

Further, with respect to the GaAs single crystal substrate, an average value of the number of particles each having a major axis of 0.16 μm or more measured at the five measurement points can be determined by measuring the entire surface of the substrate in accordance with the measurement method described in the section of <Particles having Major Axis of 0.16 μm or more>, and then analyzing data for circular regions (measurement region A1 to measurement region A5) having a diameter of 20 mm and centered at the five measurement points (first measurement point P1 to fifth measurement point P5).

[Method of Manufacturing Gallium Arsenide Single Crystal Substrate]

A method of manufacturing a gallium arsenide single crystal substrate (GaAs single crystal substrate) according to the present embodiment is preferably a method of obtaining the above-described GaAs single crystal substrate. Examples of the manufacturing method of obtaining the GaAs single crystal substrate include a first method of manufacturing a GaAs single crystal substrate, a second method of manufacturing a GaAs single crystal substrate, and a third method of manufacturing a GaAs single crystal substrate, which will be described later.

The first method of manufacturing a GaAs single crystal substrate is a method of manufacturing a GaAs single crystal substrate having a main surface having a circular shape. The method includes: preparing a gallium arsenide single crystal substrate precursor (hereinafter, also referred to as "GaAs single crystal substrate precursor") having a surface having a circular shape (preparation step); and cleaning for obtaining the GaAs single crystal substrate from the GaAs single crystal substrate precursor. The cleaning includes turning the surface of the GaAs single crystal substrate precursor into an alkali-cleaned surface by cleaning the surface with an alkali cleaning liquid (alkali cleaning step), turning the alkali-cleaned surface into an oxidized surface by subjecting the alkali-cleaned surface to oxidation treatment (oxidation treatment step), turning the oxidized surface into an acid-cleaned surface by cleaning the oxidized surface with an acid cleaning liquid (acid cleaning step), and obtaining the main surface by drying the acid-cleaned surface (drying step). The turning the alkali-cleaned surface into the oxidized surface (oxidation treatment step) includes immersing the GaAs single crystal substrate precursor in a liquid of both or one of an aqueous hydrogen peroxide solution and ozone water at a temperature equal to or higher than room temperature for 1 minute to 20 minutes. An acid concentration in the acid cleaning liquid is 0.5% by mass or more and less than 2% by mass.

A second method of manufacturing a GaAs single crystal substrate is a method of manufacturing a GaAs single crystal substrate having a main surface having a circular shape. The method includes: preparing a GaAs single crystal substrate precursor having a surface having a circular shape (preparation step); and cleaning for obtaining the GaAs single crystal substrate from the GaAs single crystal substrate precursor. The cleaning includes turning the surface of the GaAs single crystal substrate precursor into an alkali-cleaned surface by cleaning the surface with an alkali cleaning liquid (alkali cleaning step), turning the alkali-cleaned surface into an acid-cleaned surface by cleaning the alkali-cleaned surface with an acid cleaning liquid (second acid cleaning step), and obtaining the main surface by drying the acid-cleaned surface (drying step). The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant.

A third method of manufacturing a GaAs single crystal substrate is a method of manufacturing a GaAs single crystal substrate having a main surface having a circular shape. The method includes: preparing a GaAs single crystal substrate precursor having a surface having a circular shape (preparation step); and cleaning for obtaining the GaAs single crystal substrate from the GaAs single crystal substrate precursor. The cleaning includes turning the surface of the GaAs single crystal substrate precursor into an alkali-cleaned surface by cleaning the surface with an alkali cleaning liquid (alkali cleaning step), turning the alkali-cleaned surface into an oxidized surface by subjecting the alkali-cleaned surface to oxidation treatment (oxidation treatment step), turning the oxidized surface into an acid-cleaned surface by cleaning the oxidized surface with an acid cleaning liquid (third acid cleaning step), and obtaining the main surface by drying the acid-cleaned surface (drying step). The turning the alkali-cleaned surface into the oxidized surface includes immersing the GaAs single crystal substrate precursor in a liquid of both or one of an aqueous hydrogen peroxide solution and ozone water at a temperature equal to or higher than room temperature for 1 minute to 20 minutes. The acid cleaning liquid contains both or one of an alcohol and a surfactant. An acid concentration in the acid cleaning liquid is 2% by mass to 5% by mass. An acid contained in the acid cleaning liquid is hydrochloric acid, hydrofluoric acid, or nitric acid. The alcohol is isopropyl alcohol or ethanol. The surfactant is an anionic surfactant.

In the present description, the term "gallium arsenide single crystal substrate precursor (GaAs single crystal substrate precursor)" refers to a GaAs single crystal substrate having a surface having a circular shape and cut out from a gallium arsenide single crystal (hereinafter also referred to as "GaAs single crystal") manufactured by a conventionally known manufacturing method such as a so-called vertical boat method, for example, and in particular, refers to a GaAs single crystal substrate to be subjected to the respective steps included in the cleaning step.

Based on the findings obtained from the above-described XPS analysis using synchrotron radiation, the present inventors have focused on improving a conventionally known cleaning step for obtaining the GaAs single crystal substrate. In particular, the present inventors have focused on performing a treatment to reduce the content of gallium oxides in the oxide film of the GaAs single crystal substrate. Specifically, an oxidation treatment step of forcibly oxidizing the surface of the GaAs single crystal substrate precursor was newly performed. Alternatively, the acid concentration in the acid cleaning solution was increased in the acid cleaning step. In this case, since particles tend to increase on the surface, additives such as a surfactant and alcohol were added to the acid cleaning liquid in order to reduce the particles. It has been found that when such a cleaning step is performed, the oxide film can be effectively removed by thermal cleaning because a separation temperature becomes lower due to a lower content of gallium oxides in the oxide film. Furthermore, it was also found that since the particles on the surface can be reduced, LPDs on the surface of an epitaxial film caused by the particles are also reduced. As described above, the present inventors have achieved a GaAs single crystal substrate on which an epitaxial film having a reduced number of LPDs can be formed.

Figure 6:
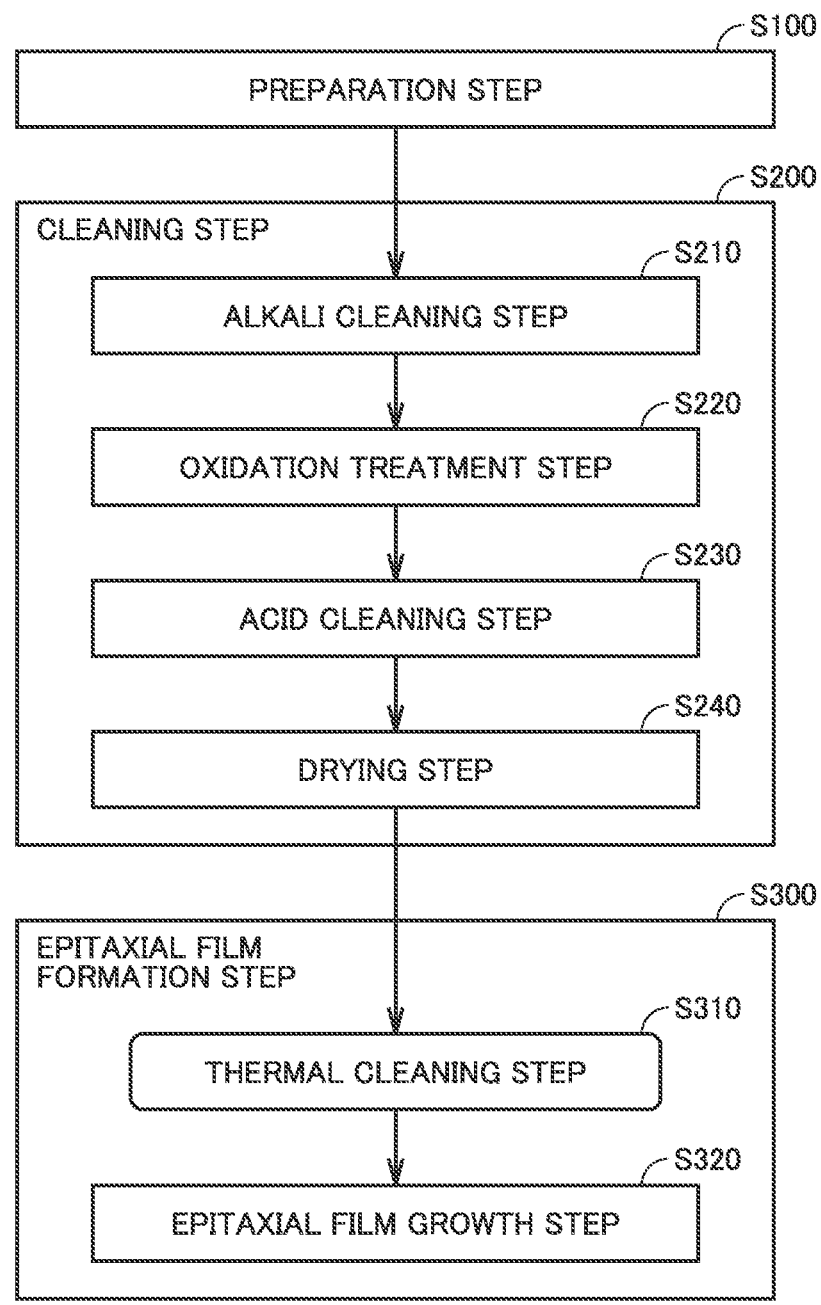
FIG. 6 is a flowchart showing a method of manufacturing a first gallium arsenide single crystal substrate according to the present embodiment.
Figure 7:
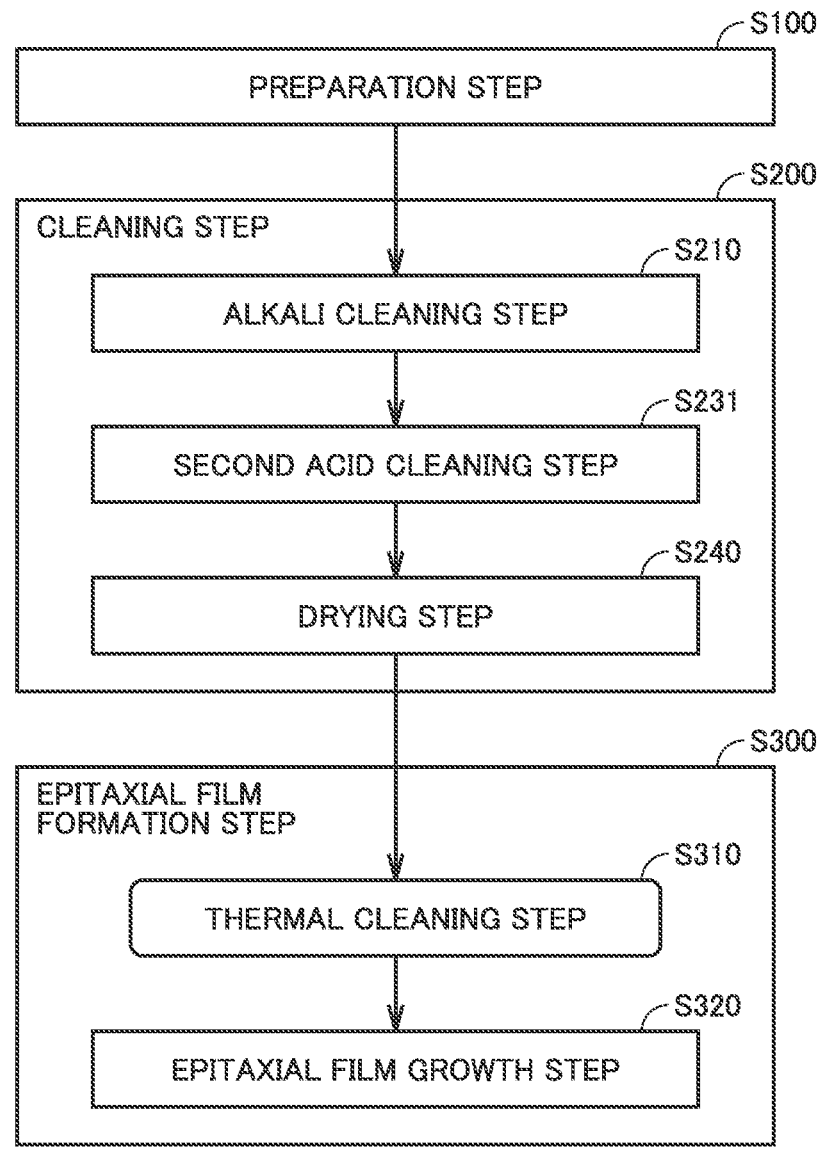
FIG. 7 is a flowchart showing a method of manufacturing a second gallium arsenide single crystal substrate according to the present embodiment.

Hereinafter, steps included in each of the first method of manufacturing a GaAs single crystal substrate, the second method of manufacturing a GaAs single crystal substrate, and the third method of manufacturing a GaAs single crystal substrate will be specifically described based on FIG. 6 to FIG. 8. FIG. 6 is a flowchart showing a method of manufacturing a first gallium arsenide single crystal substrate according to the present embodiment. FIG. 7 is a flowchart showing a method of manufacturing a second gallium arsenide single crystal substrate according to the present embodiment. FIG. 8 is a flowchart showing a method of manufacturing a third gallium arsenide single crystal substrate according to the present embodiment.

<Method of Manufacturing First GaAs Single-Crystal Substrate>

(Preparation Step S100)

The method of manufacturing the GaAs single crystal substrate includes preparing a GaAs single crystal substrate precursor having a surface having a circular shape (preparation step S100). In preparation step S100, a GaAs single crystal substrate precursor necessary for performing the cleaning step is prepared. Preparation step S100 may include carrying out a conventionally known method of manufacturing a GaAs single crystal substrate precursor. In other words, preparation step S100 may include manufacturing a gallium arsenide single crystal (hereinafter also referred to as "GaAs single crystal") using a manufacturing method such as a vertical boat method, and preparing a GaAs single crystal substrate precursor having a surface having a circular shape from the GaAs single crystal. Preparation step S100 may include processing the GaAs single crystal substrate precursor prepared from the GaAs single crystal into a desired size (for example, a disk shape having a diameter of 3 to 8 inches and a thickness of about 500 to 800 μm). As the processing method, conventionally known methods such as slicing, chamfering, surface grinding, and polishing can be used. In addition, the surface of the GaAs single crystal substrate precursor can be polished by using various polishing methods such as conventionally known mechanical polishing and chemical mechanical polishing.

(Cleaning Step S200)

The first method of manufacturing a GaAs single crystal substrate includes cleaning step S200 for obtaining the GaAs single crystal substrate from the GaAs single crystal substrate precursor. Through cleaning step S200, a GaAs single crystal substrate having an oxide film on the main surface which can be effectively removed from the GaAs single crystal substrate precursor by thermal cleaning can be obtained. In the first method of manufacturing a GaAs single crystal substrate, cleaning step S200 preferably includes turning the surface of the GaAs single crystal substrate precursor into an alkali-cleaned surface by cleaning the surface with an alkali cleaning liquid (alkali cleaning step S210), turning the alkali-cleaned surface into an oxidized surface by subjecting the alkali-cleaned surface to oxidation treatment (oxidation treatment step S220), turning the oxidized surface into an acid-cleaned surface by cleaning the oxidized surface with an acid cleaning liquid (acid cleaning step S230), and obtaining the main surface by drying the acid-cleaned surface (drying step S240). Hereinafter, each of the steps included in cleaning step S200 will be described in detail.

2. Alkali Cleaning Step S210

Alkali cleaning step S210 is a step of turning the surface of the GaAs single crystal substrate precursor into an alkali-cleaned surface by cleaning the surface with an alkali cleaning liquid. Through alkali cleaning step S210, foreign matters, impurities, and the like attached to the surface of the GaAs single crystal substrate precursor can be removed using the alkali cleaning liquid. The alkali cleaning liquid is not particularly limited, but an aqueous solution containing 0.1% by mass to 10% by mass of an organic alkali compound free of metal elements that affect electrical characteristics, for example, a quaternary ammonium hydroxide such as choline or tetramethylammonium hydroxide (TMAH), or a quaternary pyridinium hydroxide is preferably used.

3. Oxidation Treatment Step S220

Oxidation treatment step S220 is a step of turning the alkali-cleaned surface into an oxidized surface by subjecting the alkali-cleaned surface to oxidation treatment. In particular, oxidation treatment step S220 is a step of immersing the gallium arsenide single crystal substrate precursor in a liquid of both or one of an aqueous hydrogen peroxide solution and ozone water at a temperature equal to or higher than room temperature for 1 minute to 20 minutes. In oxidation treatment step S220, the alkali-cleaned surface is forcibly oxidized, so that an oxide film containing impurities in the alkali cleaning liquid attached to the alkali-cleaned surface can be formed on the alkali-cleaned surface with a uniform thickness. This can facilitate the formation of an oxide film having few impurities, good in-plane uniformity, and a low content of gallium oxides in the acid cleaning step described later.

The concentration of hydrogen peroxide contained in the liquid is preferably 0.5% by mass to 15% by mass. The concentration of ozone contained in the liquid is preferably 5 ppm by mass to 100 ppm by mass. The temperature of the liquid in which the GaAs single crystal substrate precursor is immersed is preferably equal to or higher than room temperature and 80° C. or lower. The time for immersing the GaAs single crystal substrate precursor in the liquid is preferably 2 minutes to 15 minutes. This allows formation of an oxide film having an appropriate thickness on the main surface of the GaAs single crystal substrate. When the time for immersing the GaAs single crystal substrate precursor in the liquid is less than 1 minute, the formation of the oxide film may be insufficient, and when the time is more than 20 minutes, the oxide film may become too thick.

4. Acid Cleaning Step S230

Acid cleaning step S230 is a step of turning the oxidized surface into an acid-cleaned surface by cleaning the oxidized surface with an acid cleaning liquid. Through acid cleaning step S230, the oxide film on the oxidized surface can be modified into an oxide film having a low content of gallium oxides. The acid cleaning liquid preferably contains, for example, 0.5% by mass or more and less than 2% by mass of a first acid. When the acid concentration of the first acid in the acid cleaning liquid is less than 0.5% by mass, the function of modifying the oxidized surface is reduced. When the acid concentration of the first acid in the acid cleaning liquid is 2% by mass or more, the chemical composition of the acid-cleaned surface varies due to the function of the first acid, and the ability to remove particles may be reduced.

The first acid contained in the acid cleaning liquid is not particularly limited, but is preferably an acid component which has a high cleaning power, is free of elements (for example, metal elements, sulfur, or other elements) which affect electrical characteristics, and is less likely to cause serious secondary contamination and equipment deterioration due to evaporation of the acid component together with water when droplets of the acid cleaning liquid are scattered in the equipment. For example, the first acid preferably contains at least one inorganic acid selected from the group consisting of hydrofluoric acid (HF), hydrochloric acid (HCl), nitric acid ($HNO_3$), and nitrous acid ($HNO_2$). As the first acid, an organic acid such as acetic acid, citric acid, or malic acid can also be preferably used. In addition, two or more of these acids may be used in combination, for example, hydrochloric acid and nitric acid may be used in combination.

As a cleaning method in acid cleaning step S230, a known cleaning method of immersing the oxidized surface of the GaAs single crystal substrate precursor in an acid cleaning liquid can be used. Furthermore, the acid cleaning liquid may be supplied to the oxidized surface while the GaAs single crystal substrate precursor is rotated at 100 to 800 rpm with the main surface thereof held horizontal. This allows efficient acid cleaning while suppressing excessive oxidation of the oxidized surface by forming a film of the acid cleaning liquid on the oxidized surface. When the rotation speed of the GaAs single crystal substrate precursor is lower than 100 rpm, the cleaning effect may not be improved, and when the rotation speed is higher than 800 rpm, the film of the acid cleaning liquid may not be formed, and thus the effect of suppressing oxidation may be reduced.

After acid cleaning step S230, preferably immediately after acid cleaning step S230, the acid-cleaned surface of the GaAs single crystal substrate precursor is preferably washed with pure water. The method of cleaning with pure water is not particularly limited, but it is preferable to wash the acid-cleaned surface of the GaAs single crystal substrate precursor with pure water having a dissolved oxygen concentration (DO) of 100 ppb or less for 5 minutes or less. This can suppress progress of the excessive oxidation of the acid-cleaned surface. Here, the dissolved oxygen concentration of the pure water is more preferably 50 ppb or less from the viewpoint of suppressing further progress of the excessive oxidation. From the viewpoint of few impurities, a total organic carbon (TOC) of the pure water is preferably 40 ppb or less. The method of cleaning with pure water may also be performed by supplying the above-mentioned pure water to the acid-cleaned surface while the GaAs single crystal substrate precursor is rotated at 100 to 800 rpm with the main surface thereof held horizontal.

5. Drying Step S240

Drying step S240 is a step of obtaining the main surface by drying the acid-cleaned surface. As a drying method in the drying step S240, a conventionally known method can be used.

(Epitaxial Film Formation Step S300)

Through the above steps, in the first method of manufacturing a GaAs single crystal substrate, a GaAs single crystal substrate in which an oxide film having a very small content of gallium oxides is formed on the main surface can be obtained. In the present embodiment, forming an epitaxial film on the main surface (epitaxial film formation step S300) may be performed subsequent to the first method of manufacturing a GaAs single crystal substrate. Epitaxial film formation step S300 may include a thermal cleaning step S310 and an epitaxial film growth step S320. Through epitaxial film formation step S300, a GaAs single crystal substrate in which an epitaxial film with a reduced number of LPDs is formed on the main surface can be obtained.

1. Thermal Cleaning Step S310

First, thermal cleaning step S310 can be performed on the GaAs single crystal substrate. Thermal cleaning step S310 is a step of performing thermal cleaning under a conventionally known condition such as a heating treatment at 600° C. for 10 minutes. Even under such a condition, since the separation temperature of the oxide film is low in the GaAs single crystal substrate, the oxide film can be effectively removed by the thermal cleaning.

2. Epitaxial Film Growth Step S320

In addition, a step of growing an epitaxial film on the main surface of the GaAs single crystal substrate subjected to thermal cleaning step S310 can be performed (epitaxial film growth step S320). Through this step, a GaAs single crystal substrate in which an epitaxial film with a reduced number of LPDs is formed on the main surface can be obtained. For example, the number of LPDs present on the epitaxial film and each having a major axis of 18 μm or more can be 5 or less per $cm^2$ of the main surface, and preferably 2 or less per $cm^2$ of the main surface. The lower limit of the number of LPDs each having a major axis of 18 μm or more is zero per $cm^2$ of the main surface. Thus, the GaAs single crystal substrate allows device characteristics to be improved.

In epitaxial film formation step S300, as a method of forming an epitaxial film on the main surface of the GaAs single crystal substrate, a conventionally known method can be used. The epitaxial film may be, for example, a compound film formed of $Al_{1-y-z}Ga_yIn_zAs$, where the y may be 0 to 1, the z may be 0 to 1, and the sum of the y and the z may be 0 to 1. In other words, in the present embodiment, the compound film formed of $Al_{1-y-z}Ga_yIn_zAs$ ($0 \leq y \leq 1$, $0 \leq z \leq 1$, $0 \leq y+z \leq 1$) can be applied as the epitaxial film formed on the main surface of the GaAs single crystal substrate. Furthermore, the epitaxial film can be a compound film of $Al_xGa_{1-x}As$ ($0 \leq x \leq 1$) or $Al_{1-y-z}Ga_yIn_zP$ ($0 \leq y \leq 1$, $0 \leq z \leq 1$, $0 \leq y+z \leq 1$).

The epitaxial film is formed so as to have a thickness of 0.5 to 10 μm, for example. When the thickness of the epitaxial film is in the above-mentioned range, the epitaxial substrate can be applied to a wide range of applications.

The number of LPDs each having a major axis of 18 μm or more in the epitaxial film disposed on the main surface of the GaAs single crystal substrate can be determined by a conventionally known surface foreign matter inspection apparatus (for example, trade name: "Surfscan 6220", manufactured by KLA-Tencor Corporation) in the same manner as in the method of measuring the number of particles described above. A specific measurement method is the same as the above-described measurement method of the number of particles, and thus redundant description thereof will not be repeated.

<Method of Manufacturing Second GaAs Single-Crystal Substrate>

The second method of manufacturing a GaAs single crystal substrate is a method of manufacturing a GaAs single crystal substrate including performing a new acid cleaning step (hereinafter also referred to as "second acid cleaning step") using an acid solution to which an additive such as a surfactant is added, instead of the oxidation treatment step and the subsequent acid cleaning step, in the first method of manufacturing a GaAs single crystal substrate. Hereinafter, the second acid cleaning step will be described with reference to FIG. 7. In the second method of manufacturing a GaAs single crystal substrate, the steps other than a second acid cleaning step S231 in cleaning step S200 (which replaces oxidation treatment step S220 and subsequent acid cleaning step S230 in the first method of manufacturing a GaAs single crystal substrate) are the same as those in the first method of manufacturing a GaAs single crystal substrate, and thus redundant description thereof will not be repeated.

(Second Acid Cleaning Step S231)

Second acid cleaning step S231 is a step of turning the alkali-cleaned surface into an acid-cleaned surface by cleaning the alkali-cleaned surface with an acid cleaning liquid. In particular, the acid cleaning liquid contains both or one of an alcohol and a surfactant. Through second acid cleaning step S231, impurities in the alkali cleaning liquid attached to the alkali-cleaned surface of the GaAs single crystal substrate precursor and the gallium oxide film can be removed by an oxidation reaction (etching of the alkali-cleaned surface) with the acid cleaning liquid. Furthermore, the acid cleaning liquid containing both or one of an alcohol and a surfactant can further remove particles from the alkali-cleaned surface, and facilitate removal of organic components in pure water cleaning after the acid cleaning described later. An acid concentration in the acid cleaning liquid is 2% by mass to 5% by mass. An acid contained in the acid cleaning liquid (hereinafter also referred to as "second acid") is hydrochloric acid, hydrofluoric acid, or nitric acid. The alcohol is isopropyl alcohol or ethanol. The surfactant is an anionic surfactant.

When the acid concentration of the second acid in the acid cleaning liquid is less than 2% by mass, the function of modifying the alkali-cleaned surface is reduced. When the acid concentration of the second acid in the acid cleaning liquid exceeds 5% by mass, the chemical composition of the acid-cleaned surface (or the main surface) tends to vary due to the function of the second acid. The second acid contained in the acid cleaning liquid is hydrochloric (HCl), hydrofluoric (HF) or nitric ($HNO_3$) acid. As a result, the acid cleaning liquid has a high cleaning power, is free of elements (for example, metal elements and other elements) which affect electrical characteristics, and the acid component is evaporated together with water when droplets of the acid cleaning liquid are scattered in the equipment, thereby suppressing occurrence of serious secondary contamination and equipment deterioration.

A concentration of the surfactant contained in the acid cleaning liquid is preferably 1 ppm by mass to 1000 ppm by mass. A concentration of the alcohol contained in the acid cleaning liquid is preferably 0.01% by mass to 1% by mass.

The addition of the surfactant is expected to have an effect of reducing adhesion of the particles due to a lower surface tension and an increased liquid permeability between the particles and the surface of the GaAs single crystal substrate precursor. In particular, since the hydrophilic group of an anionic surfactant is an anion (negative ion) and most of the particles on the surface of the GaAs single crystal substrate precursor are negatively charged (zeta potential is negative), it is expected that the particles are less likely to adhere to the surface by controlling a potential of the surface to be negative. The addition of the alcohol is expected to have the effect of reducing adhesion of the particles due to a lower surface tension and an increased liquid permeability between the particles and the surface of the GaAs single crystal substrate precursor as well. Since the alcohol generally has a high purity, there is also an advantage that an impurity concentration of the surface can be easily reduced.

In second acid cleaning step S231, as in acid cleaning step S230 in the first method of manufacturing a GaAs single crystal substrate, the acid cleaning liquid may be supplied to the alkali-cleaned surface while the GaAs single crystal substrate precursor is rotated at 100 to 800 rpm with the main surface thereof held horizontal. Furthermore, after second acid cleaning step S231, preferably immediately after second acid cleaning step S231, the acid-cleaned surface of the GaAs single crystal substrate precursor is preferably cleaned with pure water. Since the characteristics of the pure water are the same as those of the pure water used after acid cleaning step S230 in the first method of manufacturing a GaAs single crystal substrate, redundant description thereof will not be repeated.

<Method of Producing Third GaAs Single Crystal Substrate>

The third method of manufacturing a GaAs single crystal substrate is a method of manufacturing a GaAs single crystal substrate including, instead of the acid cleaning step in the first method of manufacturing a GaAs single crystal substrate, performing a new acid cleaning step (hereinafter also referred to as "third acid cleaning step") with an acid solution to which an additive such as a surfactant is added to be able to increase the acid concentration of the acid cleaning liquid used in the acid cleaning step. Hereinafter, the third acid cleaning step will be described with reference to FIG. 8. In the third method of manufacturing a GaAs single crystal substrate, the steps other than the third acid cleaning step S232 (which replaces acid cleaning step S230 in the first method of manufacturing a GaAs single crystal substrate) in cleaning step S200 are the same as those in the first method of manufacturing a GaAs single crystal substrate, and thus redundant description thereof will not be repeated.

(Third Acid Cleaning Step S232)

The third acid cleaning step S232 is a step of turning the oxidized surface into an acid-cleaned surface by cleaning the oxidized surface with an acid cleaning liquid. Through the third acid cleaning step S232, the oxide film on the oxidized surface can be modified into an oxide film having a lower content of the gallium oxides. In particular, in the third acid cleaning step S232, the acid cleaning liquid containing both or one of an alcohol and a surfactant can further remove impurities and particles remaining on the oxidized surface, and facilitate removal of organic components in the pure water cleaning after the acid cleaning described later. An acid concentration in the acid cleaning liquid is 2% by mass to 5% by mass. The alcohol is isopropyl alcohol or ethanol. The surfactant is an anionic surfactant.

When the acid concentration of the acid in the acid cleaning liquid is less than 2% by mass, the number of particles to be removed is small, and the effect of the acid cleaning liquid containing both or one of the alcohol and the surfactant may not be fully obtained. When the acid concentration of the acid in the acid cleaning liquid exceeds 5% by mass, the chemical composition of the acid-cleaned surface (or main surface) tends to vary due to the function of the acid. The acid contained in the acid cleaning liquid is hydrochloric (HCl), hydrofluoric (HF) or nitric ($HNO_3$) acid. As a result, the acid cleaning liquid has a high cleaning power, is free of elements (for example, metal elements and other elements) which affect electrical characteristics, and the acid component is evaporated together with water when droplets of the acid cleaning liquid are scattered in the equipment, thereby suppressing occurrence of serious secondary contamination and equipment deterioration.

A concentration of the surfactant contained in the acid cleaning liquid is preferably 1 ppm by mass to 1000 ppm by mass. A concentration of the alcohol contained in the acid cleaning liquid is preferably 0.01% by mass to 1% by mass.

The addition of the surfactant and the addition of the alcohol respectively have the same effects as the addition of the surfactant and the addition of the alcohol described for second acid cleaning step S231 in the second method of manufacturing a GaAs single crystal substrate, and thus redundant description thereof will not be repeated.

In third acid cleaning step S232, as in acid cleaning step S230 in the first method of manufacturing a GaAs single crystal substrate, the acid cleaning liquid may be supplied to the oxidized surface while the GaAs single crystal substrate precursor is rotated at 100 to 800 rpm with the main surface thereof held horizontal. Furthermore, after third acid cleaning step S232, preferably immediately after third acid cleaning step S232, the acid-cleaned surface of the GaAs single crystal substrate precursor is preferably cleaned with pure water. Since the characteristics of the pure water are the same as those of the pure water used after acid cleaning step S230 in the first method of manufacturing a GaAs single crystal substrate, redundant description thereof will not be repeated.

<Function and Effect>

By the method of manufacturing a GaAs single crystal substrate according to the present embodiments (the first method of manufacturing a GaAs single crystal substrate, the second method of manufacturing a GaAs single crystal substrate, and the third method of manufacturing a GaAs single crystal substrate), a GaAs single crystal substrate in which an oxide film having a low content of gallium oxides can be formed on the main surface and the number of particles present on the main surface is small can be obtained. In such a GaAs single crystal substrate, since the separation temperature of the oxide film is low, the oxide film can be effectively removed by thermal cleaning, and failures in epitaxial film caused by the particles can also be reduced, so that an epitaxial film with a reduced number of LPDs can be formed thereon.

Example

Hereinafter, the present disclosure will be described in more detail with Examples, but the present disclosure is not limited thereto. Among the GaAs single crystal substrates from Sample 1 to Sample 18 described below, Sample 4, Sample 7 to Sample 10, and Sample 12 to Sample 18 are examples of the present disclosure, and Sample 1 to Sample 3, Sample 5, Sample 6, and Sample 11 are comparative examples.

[Production of GaAs Single Crystal Substrate]

[Sample 1]

<Preparation Step>

A silicon (Si) atom-doped conductive GaAs single crystal grown by the vertical Bridgman (VB) method was sliced with a wire saw, and the edge portion was ground to prepare a GaAs single crystal substrate precursor. The main surface of the GaAs single crystal substrate precursor was ground with a surface grinding machine, and then the main surface was polished with a hard polishing cloth including a mixture of a chlorine-based polishing agent and silica powders in a clean room. Subsequently, the main surface was mirror-finished by polishing with an INSEC NIB polishing agent (manufactured by FUJIMI INCORPORATED). Furthermore, the main surface was roughly cleaned by performing ultrasonic cleaning with isopropyl alcohol (IPA). As described above, a required number of GaAs single crystal substrate precursors each having a diameter of 6 inches (150 mm) and a thickness of 680 μm were prepared.

<Cleaning Step>

(Alkali Cleaning Step)

The GaAs single crystal substrate precursors were immersed in a 1 mass % choline aqueous solution by a vertical-batch method. At the same time, ultrasonic waves were applied to the entire surfaces of the GaAs single crystal substrate precursors for 5 minutes under a condition of a frequency of 500 kHz and a sound pressure of 10 mV. In this manner, the surfaces of the GaAs single crystal substrate precursors were alkali-cleaned. Next, the alkali-cleaned surfaces of the GaAs single crystal substrate precursors were cleaned with pure water having a dissolved oxygen concentration (DO) of 1 ppb by mass for 5 minutes. The total organic carbon (TOC) of this pure water was 0.5 ppb by mass.

(Acid Cleaning Step)

The GaAs single crystal substrate precursors were placed in a single-wafer cleaning apparatus, and the alkali-cleaned surfaces were subjected to acid cleaning with an acid cleaning liquid containing 0.05% by mass of hydrofluoric acid while being rotated at a rotation speed 500 rpm. In the acid cleaning, at room temperature (25° C.), 1 liter of the acid cleaning liquid was supplied to the alkali-cleaned surfaces of the GaAs single crystal substrate precursors for 1 minute. Furthermore, the GaAs single crystal substrate precursors were rinsed with the same ultrapure water as used in the alkali cleaning step for 3 minutes at a supply rate of 1 L/min. Through this step, the alkali-cleaned surfaces were regarded as acid-cleaned surfaces.

(Drying Step)

The acid-cleaned surfaces of the GaAs single crystal substrate precursors were rotated at 2500 rpm for 15 to 30 seconds to be dried, and a required number of GaAs single crystal substrates for Sample 1 having a main surface having a circular shape were obtained.

<Epitaxial Film Formation Step>

The GaAs single crystal substrate was subjected to thermal cleaning in a metal-organic vapor phase epitaxial growth furnace under a condition of 600° C. and 10 minutes in an atmosphere in which arsine gas was added to hydrogen gas (thermal cleaning step). Furthermore, subsequently to the thermal cleaning step, an $Al_{0.4}Ga_{0.6}As$ layer having a thickness of 4 μm was grown as an epitaxial layer on the main surface of the GaAs single crystal substrate by a metal-organic vapor phase epitaxial growth method (MOVPE method) (epitaxial film growth step; the GaAs single crystal substrate having the epitaxial layer grown on the main surface is hereinafter also referred to as "epitaxial substrate"). Thus, epitaxial substrate for Sample 1 was obtained. When the epitaxial layer was grown, the GaAs single crystal substrate was heated to 550° C.

[Sample 2]

A required number of GaAs single crystal substrates for Sample 2 were obtained in the same manner as in Sample 1 except that the following oxidation treatment step was performed between the alkali cleaning step and the acid cleaning step in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

(Oxidation Treatment Step)

The alkali-cleaned surfaces of the GaAs single crystal substrate precursors were immersed in a hydrogen peroxide aqueous solution containing 3% by mass of hydrogen peroxide for 10 minutes by a vertical-batch method, thereby performing oxidation treatment. The oxidation treatment was performed at room temperature (25° C.). Furthermore, the GaAs single crystal substrate precursors were rinsed with the same ultrapure water as used in the alkali cleaning step for 3 minutes at a supply rate of 1 L/min. In this manner, the alkali-cleaned surfaces were turned into oxidized surfaces.

[Sample 3]

A required number of GaAs single crystal substrates for Sample 3 were obtained in the same manner as Sample 1 except that the concentration of hydrofluoric acid contained in the acid cleaning liquid was 0.5% by mass in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 4]

A required number of GaAs single crystal substrates for Sample 4 were obtained in the same manner as in Sample 3 except that the oxidation treatment step was performed between the alkali cleaning step and the acid cleaning step in the cleaning step in the same manner as in Sample 2. Furthermore, for one of the GaAs single crystal substrates, an $Al_{0.4}Ga_{0.6}$ As layer having a thickness of 4 μm was grown as an epitaxial layer on the main surface thereof in the same manner as in Sample 1.

[Sample 5]

A required number of GaAs single crystal substrates for Sample 5 were obtained in the same manner as in Sample 1 except that the concentration of hydrofluoric acid contained in the acid cleaning liquid was 2% by mass in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 6]

A required number of GaAs single crystal substrates for Sample 6 were obtained in the same manner as in Sample 5 except that the oxidation treatment step was performed between the alkali cleaning step and the acid cleaning step in the cleaning step in the same manner as in Sample 2. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 7]

A required number of GaAs single crystal substrates for Sample 7 were obtained in the same manner as in Sample 5 except that in the cleaning step, a fluorine-based anionic surfactant (trade name: "Surflon S-211", manufactured by AGC Seimi Chemical Co., Ltd.) was added to the acid cleaning liquid used in the acid cleaning step so as to have a concentration of 10 ppm by mass. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 8]

A required number of GaAs single crystal substrates for Sample 8 were obtained in the same manner as in Sample 5 except that the oxidation treatment step was performed between the alkali cleaning step and the acid cleaning step in the cleaning step in the same manner as in Sample 2, and the acid cleaning step was performed in the same manner as in Sample 7. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 9]

A required number of GaAs single crystal substrates for Sample 9 were obtained in the same manner as in Sample 4 except that multiple GaAs single crystal substrate precursors each having a diameter of 8 inches (200 mm) and a thickness of 680 μm were prepared from the Si-atom-doped conductive GaAs single crystal grown by the vertical Bridgman (VB) method in the preparation step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 10]

A required number of GaAs single crystal substrates for Sample 10 were obtained in the same manner as in Sample 8 except that multiple GaAs single crystal substrate precursors each having a diameter of 8 inches (200 mm) and a thickness of 680 μm were prepared from the Si-atom-doped conductive GaAs single crystal grown by the vertical Bridgman (VB) method in the preparation step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 11]

The GaAs single crystal substrate precursors manufactured in the same manner as in Sample 1 were subjected to the following cleaning step to obtain a required number of GaAs single crystal substrates for Sample 11. In other words, in the cleaning step, the surfaces of the GaAs single crystal substrate precursors were irradiated with high-pressure mercury lamp (having a wavelength of 200 to 450 nm). The surfaces were irradiated with light having a wavelength of 200 to 450 nm under an irradiation condition of an intensity of 20 mW and a duration of 1 minute while being slowly rotated. Next, the GaAs single crystal substrate precursors were immersed in a 0.5 mass % aqueous ammonia solution and cleaned under hypersonic waves (so-called megasonic waves) near 1 MHz. Thereafter, the GaAs single crystal substrate precursors were cleaned with water and dried. Subsequently, the GaAs single crystal substrate precursors were cleaned with a 0.2 mass % hydrogen fluoride aqueous solution, cleaned with water, and then dried. Drying was performed by Marangoni drying using isopropyl alcohol. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 12]

A required number of GaAs single crystal substrates for Sample 12 were obtained in the same manner as in Sample 5 except that isopropyl alcohol was added to the acid cleaning solution used in the acid cleaning step so as to have a concentration of 0.1% by mass in the cleaning step. Further, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 13]

A required number of GaAs single crystal substrates for Sample 13 were obtained in the same manner as in Sample 5 except that the oxidation treatment step was performed between the alkali cleaning step and the acid cleaning step in the cleaning step in the same manner as in Sample 2, and isopropyl alcohol was added to the acid cleaning solution used in the acid cleaning step so as to be 0.1% by mass. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 14]

A required number of GaAs single crystal substrates for Sample 14 were obtained in the same manner as in Sample 13 except that multiple GaAs single crystal substrate precursors each having a diameter of 8 inches (200 mm) and a thickness of 680 μm were prepared from the Si-atom-doped conductive GaAs single crystal grown by the vertical Bridgman (VB) method in the preparation step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 15]

A required number of GaAs single crystal substrates for Sample 15 were obtained in the same manner as in Sample 8 except that the concentration of hydrofluoric acid contained in the acid cleaning liquid was 5% by mass in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 16]

A required number of GaAs single crystal substrates for Sample 16 were obtained in the same manner as in Sample 13 except that the concentration of hydrofluoric acid contained in the acid cleaning liquid was 5% by mass in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 17]

A required number of GaAs single crystal substrates for Sample 17 were obtained in the same manner as in Sample 10 except that the concentration of hydrofluoric acid contained in the acid cleaning liquid was 5% by mass in the cleaning step. Furthermore, for one of the GaAs single crystal substrates, an $Al_{0.4}Ga_{0.6}As$ layer having a thickness of 4 μm was grown as an epitaxial layer on the main surface thereof in the same manner as in Sample 1.

[Sample 18]

A required number of GaAs single crystal substrates for Sample 18 were obtained in the same manner as in Sample 14 except that the concentration of hydrofluoric acid contained in the acid cleaning liquid was 5% by mass in the cleaning step. Furthermore, for one of the GaAs single crystal substrates, an $Al_{0.4}Ga_{0.6}As$ layer having a thickness of 4 µm was grown as an epitaxial layer on the main surface thereof in the same manner as in Sample 1.

[First Test]

<Analysis of GaAs Single-Crystal Substrate by XPS Using Synchrotron Radiation and MSM Analysis>

The beam line "BL17" which is one of beam lines only for Sumitomo Electric Industries, Ltd. in Saga Prefecture Kyushu Synchrotron Light Research Center was used to prepare X-rays having an energy of 150 eV or 600 eV. Analysis using X-ray photoelectron spectroscopy was performed by irradiating the centers of the main surfaces of the GaAs single crystal substrates for Sample 1 to Sample 18 with the X-rays. Since the entire GaAs single crystal substrate for each of Samples 1 to 18 cannot be placed on a sample stage, a central portion of the GaAs single crystal substrate for each of Samples 1 to 18 was cut out to obtain a specimen, and the specimen was analyzed.

The analysis conditions are as follows.

Condition 1: incident X-ray energy of 150 eV, and photoelectron take-off angle of 30°
Condition 2: incident X-ray energy of 150 eV, and photoelectron take-off angle of 45°
Condition 3: incident X-ray energy of 150 eV, and photoelectron take-off angle of 85°
Condition 4: incident X-ray energy of 600 eV, and photoelectron take-off angle of 45°
condition 5: incident X-ray energy of 600 eV, and photoelectron take-off angle of 85°
Size of specimen under each condition: 10 mm×10 mm
Ambient pressure on specimen under each condition: $4 \times 10^{-7}$ Pa
High-resolution XPS analyzer used for each condition (trade name: "R3000", manufactured by Scienta Omicron, Inc.)
Energy resolution E/ΔE: 3480
Plot interval of binding energy: 0.02 eV
Integration time and number of integrations at each energy value: 100 ms, 50 times.

Next, for each specimen corresponding to the GaAs single crystal substrates from Sample 1 to Sample 18, the first integrated intensity ratio ($Ga_xO/GaAs$) which is a ratio of the sum of an integrated intensity of Ga element present as $Ga_2O$ and an integrated intensity of Ga element present as $Ga_2O_3$ to an integrated intensity of Ga element present as GaAs was obtained based on a Ga3d spectrum and a As3d spectrum determined by the analysis performed under Condition 3. The second integrated intensity ratio ($Ga_xO/As_xO$) which is a ratio of the sum of the integrated intensity of Ga element present as the $Ga_2O$ and the integrated intensity of Ga element present as the $Ga_2O_3$ to the sum of an integrated intensity of As element present as $As_2O_5$ and an integrated intensity of As element present as $As_2O_3$ was also obtained. The results are shown in Table 1.

Furthermore, the Ga3d spectrum and the As3d spectrum determined by the analysis performed under each of the above-described conditions (Condition 1 to Condition 5) for each specimen corresponding to the GaAs single crystal substrates from Sample 1 to Sample 18 were applied to the above-described MSM analysis. Thus, the first analytical value which is a content of gallium oxides ($Ga_xO$) present as $Ga_2O$ and $Ga_2O_3$ in a region from the main surface of the GaAs single crystal substrate to a depth of 2 nm was obtained. The second analytical value ($Ga_xO/As_xO$) which is a ratio of the content of the gallium oxides ($Ga_xO$) to a content of arsenic oxides ($As_xO$) present as $As_2O_5$ and $As_2O_3$ in the region from the main surface of the GaAs single crystal substrate to a depth of 2 nm was also obtained. The results are shown in Table 1.

<Particles Each Having a Major Axis of 0.16 µm or More>

The main surface of the GaAs single crystal substrate for each of Sample 1 to Sample 18 was observed using the above-described surface inspection apparatus (trade name: "Surfscan 6220", manufactured by KLA-Tencor Corporation). A GaAs single crystal substrate to be observed is different from the substrate used for the XPS analysis and the MSM analysis, but is processed at the same time. The entire surface of the substrate was observed, and the number of particles present on the main surface and each having a major axis of 0.16 µm or more per $cm^2$ was determined for a center portion of the substrate (a region having a diameter of 20 mm and including first measurement point P1, i.e., measurement region A1). The results are shown in Table 1.

<Number of LPDs Each Having a Major Axis of 18 µm or More on Surface of Epitaxial Film>

First, epitaxial growth was performed on a GaAs single crystal substrate for which the number of particles each having a major axis of 0.16 µm or more per $cm^2$ was determined as described above, to obtain an epitaxial substrate for each of Sample 1 to Sample 18. Next, the surface of the epitaxial film in the epitaxial substrate was observed using the above-described surface inspection apparatus (trade name: "Surfscan 6220", manufactured by KLA-Tencor Corporation). In the measurement, the entire surface of the epitaxial substrate was observed, and the number of LPDs present on the surface and each having a major axis of 18 µm or more per $cm^2$ was obtained for a central portion of the epitaxial substrate (a region having a diameter of 20 mm and including a measurement point on the surface of the epitaxial film corresponding to first measurement point P1, i.e., a region on the surface of the epitaxial film corresponding to measurement region A1). The results are shown in Table 1. Since device characteristics deteriorate in a portion where LPDs are present, it is considered that the LPDs are failure in film formation caused by an oxide film or particles in a GaAs single crystal substrate. When the number of LPDs per $cm^2$ is 5 or less, a satisfactory device yield is obtained, and a high device yield can be obtained by using such a substrate.

TABLE 1

| Sample No. | Measurement Point | First Integrated Intensity Ratio ($Ga_xO/GaAs$) | Second Integrated Intensity Ratio ($Ga_xO/As_xO$) | First Analytical Value [nm] ($Ga_xO$) | Second Analytical Value ($Ga_xO/As_xO$) | Particle [/$cm^2$] | Number of LPDs [/$cm^2$] |
|---|---|---|---|---|---|---|---|
| 1 | P1 | 18.3 | 1.52 | 0.69 | 1.59 | 3.5 | 10.5 |
| 2 | P1 | 17.1 | 1.44 | 0.67 | 1.55 | 0.7 | 8.1 |
| 3 | P1 | 11.8 | 1.18 | 0.55 | 1.36 | 6.8 | 15.9 |
| 4 | P1 | 11.7 | 1.14 | 0.52 | 1.32 | 2 | 4.9 |
| 5 | P1 | 4.1 | 0.73 | 0.34 | 0.98 | 11.4 | 23.6 |
| 6 | P1 | 3.2 | 0.69 | 0.33 | 0.95 | 7.2 | 14.8 |

TABLE 1-continued

| Sample No. | Measurement Point | First Integrated Intensity Ratio ($Ga_xO/GaAs$) | Second Integrated Intensity Ratio ($Ga_xO/As_xO$) | First Analytical Value [nm] ($Ga_xO$) | Second Analytical Value ($Ga_xO/As_xO$) | Particle [/cm²] | Number of LPDs [/cm²] |
|---|---|---|---|---|---|---|---|
| 7 | P1 | 2.3 | 0.63 | 0.32 | 0.94 | 1.8 | 4.3 |
| 8 | P1 | 2.0 | 0.61 | 0.3 | 0.91 | 0.17 | 0.55 |
| 9 | P1 | 10.3 | 1.02 | 0.47 | 1.17 | 2 | 4.8 |
| 10 | P1 | 2.2 | 0.63 | 0.32 | 0.94 | 0.34 | 0.98 |
| 11 | P1 | 12.5 | 1.14 | 0.56 | 1.37 | 4.4 | 11.1 |
| 12 | P1 | 2.2 | 0.62 | 0.32 | 0.93 | 1.9 | 4.7 |
| 13 | P1 | 2.5 | 0.63 | 0.31 | 0.92 | 0.41 | 1.2 |
| 14 | P1 | 2.7 | 0.65 | 0.32 | 0.94 | 0.63 | 1.7 |
| 15 | P1 | 0.83 | 0.48 | 0.23 | 0.71 | 0.52 | 0.87 |
| 16 | P1 | 0.89 | 0.49 | 0.25 | 0.77 | 0.67 | 0.98 |
| 17 | P1 | 0.88 | 0.49 | 0.24 | 0.75 | 0.74 | 1.5 |
| 18 | P1 | 0.92 | 0.51 | 0.26 | 0.78 | 0.83 | 1.7 |

DISCUSSION

According to Table 1 above, the GaAs single crystal substrates of Sample 4, Sample 7 to Sample 10, and Sample 12 to Sample 18 all had a first integrated intensity ratio of 12 or less and a second integrated intensity ratio of 1.2 or less. The GaAs single crystal substrates of Sample 4, Sample 7 to Sample 10, and Sample 12 to Sample 18 all had a first analytical value of 0.6 nm or less and a second analytical value of 1.4 or less. Furthermore, in each of the GaAs single crystal substrates of Sample 4, Sample 7 to Sample 10, and Sample 12 to Sample 18, the number of particles present on the main surface and each having a major axis of 0.16 μm or more per cm² was 2 or less. In this case, in each of the epitaxial substrates of Sample 4, Sample 7 to Sample 10, and Sample 12 to Sample 18, the number of LPDs present on the surface and each having a major axis of 18 μm or more per cm² was 5 or less. Therefore, it was suggested that the GaAs single crystal substrates of Sample 4, Sample 7 to Sample 10, and Sample 12 to Sample 18 enable a high device yield.

[Second Test]

<Uniformity Analysis of Main Surface of GaAs Single Crystal Substrate>

In the second test, GaAs single crystal substrates of Sample 4, Sample 7 to Sample 10, and Sample 12 to Sample 18 in which the number of LPDs of the epitaxial films in the central portions of the substrates (regions corresponding to measurement regions A1) were evaluated to be good (5 or less) in the first test were used for the test. Four specimens cut out from the outer peripheral portion of each main surface of the substrates were analyzed in the same manner as the method described in the section of <Analysis of GaAs Single-Crystal Substrate by XPS using synchrotron radiation and MSM analysis> in the first test. Specifically, specimens each having a size of 10 mm×10 mm and centered on second measurement point P2, third measurement point P3, fourth measurement point P4, and fifth measurement point P5 shown in FIG. 3 were cut from each of the GaAs single crystal substrates used in the test of the section of <Analysis of GaAs Single-Crystal Substrate by XPS using synchrotron radiation and MSM analysis>.

Next, for each of the specimens, a third integrated intensity ratio ($Ga_xO/GaAs$) which is an average value of the ratio of the sum of the integrated intensity of Ga element present as $Ga_2O$ and the integrated intensity of Ga element present as $Ga_2O_3$ to the integrated intensity of Ga element present as GaAs, was obtained based on five Ga3d spectra and five As3d spectra corresponding to the five specimens determined by the analysis performed under the condition 3. A fourth integrated intensity ratio ($Ga_xO/As_xO$) which is an average value of the ratio of the sum of the integrated intensity of Ga element present as the $Ga_2O$ and the integrated intensity of Ga element present as the $Ga_2O_3$ to the sum of the integrated intensity of As element present as $As_2O_5$ and the integrated intensity of As element present as $As_2O_3$ was also obtained. The results are shown in Table 2 to Table 4. In Table 2 to Table 4, the "third integrated intensity ratio" is shown in a field where the row of the item "Ave" overlaps the column of the item "third integrated intensity ratio ($Ga_xO/GaAs$)" for each sample. In addition, the "fourth integrated intensity ratio" is shown in a field where the row of the item "Ave" overlaps the column of the item "fourth integrated intensity ratio ($Ga_xO/As_xO$)" for each sample.

Furthermore, for each of the specimens, five Ga3d spectra and five As3d spectra corresponding to the five specimens obtained by the analysis performed under the conditions (conditions 1 to 5) were applied to the MSM analysis described above. Thus, a third analytical value which is an average value of the content of gallium oxides ($Ga_xO$) present as $Ga_2O$ and $Ga_2O_3$ in a region from the main surface of the GaAs single crystal substrate to a depth of 2 nm was obtained. A fourth analytical value ($Ga_xO/As_xO$) which is an average value of the ratio of the content of the gallium oxides ($Ga_xO$) to the content of the arsenic oxides ($As_xO$) present as $As_2O_5$ and $As_2O_3$ in the region from the main surface of the GaAs single crystal substrate to a depth of 2 nm was also obtained. The results are shown in Table 2 to Table 4. In Table 2 to Table 4, the "third analytical value" is shown in a field where the row of the item "Ave" overlaps the column of the item "third analytical value [nm] ($Ga_xO$)" for each sample. In addition, the "fourth analytical value" is shown in a field where the row of the item "Ave" overlaps the column of the item "fourth analytical value ($Ga_xO/As_xO$)" for each sample.

An average value of the number of particles each having a major axis of 0.16 μm or more per cm² at the measurement points (i.e., second measurement point P2, third measurement point P3, fourth measurement point P4, and fifth measurement point P5 shown in FIG. 3) in the outer peripheral portion of each of the GaAs single crystal substrates was determined using the observation data on the particles on the entire surface of each of the GaAs single crystal substrates obtained from the test in the section of <Particles having Major Axis of 0.16 μm or more> in the first test. Furthermore, an average value of the number of LPDs present on the surface of the epitaxial film and each having a major axis of 18 μm or more per cm$^2$ at the measurement points in the outer peripheral portion of each of the epitaxial substrates was determined using the observation data on the LPDs on the entire surface of each of the epitaxial substrates obtained from the test in the item of <Number of LPDs each having a Major Axis of 18 μm or more on Surface of Epitaxial Film> in the first test. The results are shown in Table 2 to Table 4. In Table 2 to Table 4, the "average value of the number of particles per cm$^2$" is shown in a field where the row of the item "Ave" overlaps the column of the item "particles [/cm$^2$]" for each sample. In addition, the "average value of the number of LPDs" is shown in a field where the row of the item "Ave" overlaps the column of the item "number of LPDs [/cm$^2$]" for each sample.

TABLE 2

| Sample No. | Measurement Point | Third Integrated Intensity Ratio (Ga$_x$O/GaAs) | Fourth Integrated Intensity Ratio (Ga$_x$O/As$_x$O) | Third Analytical Value [nm] (Ga$_x$O) | Fourth Analytical Value (Ga$_x$O/As$_x$O) | Particle [/cm$^2$] | Number of LPDs [/cm$^2$] |
|---|---|---|---|---|---|---|---|
| 4 | P1 | 11.7 | 1.14 | 0.52 | 1.32 | 2.0 | 4.9 |
| | P2 | 13.1 | 1.22 | 0.57 | 1.37 | 1.3 | 4.4 |
| | P3 | 12.3 | 1.18 | 0.53 | 1.3 | 1.4 | 4.6 |
| | P4 | 13.5 | 1.24 | 0.56 | 1.35 | 1.2 | 4.2 |
| | P5 | 15.3 | 1.34 | 0.62 | 1.48 | 1.1 | 3.4 |
| | Ave | 13.2 | 1.22 | 0.56 | 1.36 | 1.4 | 4.3 |
| 7 | P1 | 2.3 | 0.63 | 0.32 | 0.94 | 1.8 | 4.3 |
| | P2 | 2.7 | 0.67 | 0.33 | 0.96 | 1.5 | 3.7 |
| | P3 | 2.5 | 0.66 | 0.33 | 0.98 | 1.4 | 2.3 |
| | P4 | 2.8 | 0.67 | 0.35 | 1.02 | 1.6 | 3.8 |
| | P5 | 3.3 | 0.75 | 0.38 | 1.1 | 0.87 | 2.3 |
| | Ave | 2.7 | 0.68 | 0.34 | 1.0 | 1.4 | 4.7 |
| 8 | P1 | 2.0 | 0.61 | 0.3 | 0.91 | 0.17 | 0.55 |
| | P2 | 2.2 | 0.65 | 0.32 | 0.94 | 0.14 | 0.68 |
| | P3 | 2.2 | 0.64 | 0.33 | 0.96 | 0.12 | 0.46 |
| | P4 | 2.5 | 0.67 | 0.34 | 0.98 | 0.11 | 0.72 |
| | P5 | 2.9 | 0.73 | 0.37 | 1.08 | 0.1 | 0.68 |
| | Ave | 2.4 | 0.66 | 0.33 | 0.97 | 0.13 | 0.60 |
| 9 | P1 | 10.3 | 1.02 | 0.47 | 1.17 | 2.0 | 4.8 |
| | P2 | 14.3 | 1.26 | 0.58 | 1.39 | 1.4 | 3.7 |
| | P3 | 13.1 | 1.19 | 0.57 | 1.37 | 2.2 | 5.5 |
| | P4 | 14.8 | 1.29 | 0.59 | 1.41 | 1.6 | 4.9 |
| | P5 | 16.1 | 1.37 | 0.63 | 1.49 | 1.0 | 3.1 |
| | Ave | 13.7 | 1.23 | 0.57 | 1.37 | 1.6 | 4.4 |

TABLE 3

| Sample No. | Measurement Point | Third Integrated Intensity Ratio (Ga$_x$O/GaAs) | Fourth Integrated Intensity Ratio (Ga$_x$O/As$_x$O) | Third Analytical Value [nm] (Ga$_x$O) | Fourth Analytical Value (Ga$_x$O/As$_x$O) | Particle [/cm$^2$] | Number of LPDs [/cm$^2$] |
|---|---|---|---|---|---|---|---|
| 10 | P1 | 2.2 | 0.63 | 0.32 | 0.94 | 0.34 | 0.98 |
| | P2 | 3.9 | 0.74 | 0.36 | 1.02 | 0.18 | 0.93 |
| | P3 | 2.8 | 0.67 | 0.33 | 0.98 | 6.8 | 0.66 |
| | P4 | 3.8 | 0.72 | 0.36 | 1.12 | 0.25 | 1.0 |
| | P5 | 4.8 | 0.83 | 0.43 | 1.25 | 0.2 | 1.4 |
| | Ave | 3.5 | 0.72 | 0.36 | 1.06 | 0.13 | 1.0 |
| 12 | P1 | 2.2 | 0.62 | 0.32 | 0.93 | 1.9 | 4.7 |
| | P2 | 2.9 | 0.68 | 0.34 | 0.98 | 1.7 | 4.3 |
| | P3 | 3.2 | 0.69 | 0.35 | 1.1 | 1.6 | 4.1 |
| | P4 | 2.7 | 0.7 | 0.33 | 0.96 | 1.6 | 4.0 |
| | P5 | 3.7 | 0.79 | 0.4 | 1.16 | 1.3 | 3.0 |
| | Ave | 2.9 | 0.7 | 0.35 | 1.03 | 0.6 | 4.0 |
| 13 | P1 | 2.5 | 0.63 | 0.31 | 0.92 | 0.41 | 1.2 |
| | P2 | 3.2 | 0.7 | 0.34 | 0.98 | 0.39 | 1.2 |
| | P3 | 2.7 | 0.67 | 0.33 | 0.96 | 0.23 | 0.77 |
| | P4 | 3.8 | 0.72 | 0.36 | 1.05 | 0.23 | 1.0 |
| | P5 | 4.1 | 0.79 | 0.41 | 1.15 | 0.22 | 0.95 |
| | Ave | 3.3 | 0.7 | 0.35 | 1.01 | 0.30 | 1.0 |
| 14 | P1 | 2.7 | 0.65 | 0.32 | 0.94 | 0.63 | 1.7 |
| | P2 | 4.4 | 0.75 | 0.38 | 1.05 | 0.42 | 1.5 |
| | P3 | 2.9 | 0.68 | 0.34 | 0.98 | 0.27 | 0.91 |
| | P4 | 4.7 | 0.78 | 0.38 | 1.06 | 0.38 | 1.5 |
| | P5 | 5.3 | 0.87 | 0.45 | 1.25 | 0.30 | 1.5 |
| | Ave | 4.0 | 0.75 | 0.37 | 1.06 | 0.40 | 1.4 |

TABLE 4

| Sample No. | Measurement Point | Third Integrated Intensity Ratio (Ga$_x$O/GaAs) | Fourth Integrated Intensity Ratio (Ga$_x$O/As$_x$O) | Third Analytical Value [nm] (Ga$_x$O) | Fourth Analytical Value (Ga$_x$O/As$_x$O) | Particle [/cm$^2$] | Number of LPDs [/cm$^2$] |
|---|---|---|---|---|---|---|---|
| 15 | P1 | 0.83 | 0.48 | 0.23 | 0.71 | 0.52 | 0.87 |
|  | P2 | 1.3 | 0.61 | 0.32 | 0.91 | 0.46 | 0.79 |
|  | P3 | 1.1 | 0.59 | 0.28 | 0.85 | 0.55 | 0.94 |
|  | P4 | 1.4 | 0.62 | 0.30 | 0.92 | 0.37 | 0.69 |
|  | P5 | 1.6 | 0.66 | 0.31 | 0.98 | 0.25 | 0.49 |
|  | Ave | 1.2 | 0.59 | 0.29 | 0.87 | 0.43 | 0.80 |
| 16 | P1 | 0.89 | 0.49 | 0.25 | 0.77 | 0.67 | 0.98 |
|  | P2 | 1.5 | 0.63 | 0.33 | 0.93 | 0.45 | 0.91 |
|  | P3 | 1.2 | 0.52 | 0.30 | 0.88 | 0.49 | 0.97 |
|  | P4 | 1.6 | 0.65 | 0.33 | 0.94 | 0.38 | 0.77 |
|  | P5 | 2.0 | 0.70 | 0.36 | 1.02 | 0.29 | 0.62 |
|  | Ave | 1.4 | 0.60 | 0.32 | 0.91 | 0.46 | 0.90 |
| 17 | P1 | 0.88 | 0.49 | 0.24 | 0.75 | 0.74 | 1.5 |
|  | P2 | 1.7 | 0.63 | 0.33 | 0.97 | 0.51 | 1.2 |
|  | P3 | 1.3 | 0.54 | 0.30 | 0.91 | 0.67 | 1.4 |
|  | P4 | 1.7 | 0.63 | 0.31 | 1.93 | 0.44 | 1.0 |
|  | P5 | 2.2 | 0.70 | 0.35 | 1.10 | 0.21 | 0.64 |
|  | Ave | 1.6 | 0.60 | 0.31 | 0.93 | 0.51 | 1.1 |
| 18 | P1 | 0.88 | 0.51 | 0.26 | 0.78 | 0.86 | 1.7 |
|  | P2 | 1.8 | 0.65 | 0.35 | 1.10 | 0.53 | 1.2 |
|  | P3 | 1.4 | 0.56 | 0.31 | 0.94 | 0.69 | 1.5 |
|  | P4 | 1.9 | 0.68 | 0.33 | 0.97 | 0.49 | 1.1 |
|  | P5 | 2.3 | 0.72 | 0.38 | 1.18 | 0.31 | 0.68 |
|  | Ave | 1.7 | 0.62 | 0.33 | 0.99 | 0.58 | 1.2 |

DISCUSSION

According to Table 2 to Table 4, the GaAs single crystal substrates for Sample 4, Sample 7 to Sample 10, and Sample 12 to Sample 18 all had a third integrated intensity ratio of 13.7 or less, and a fourth integrated intensity ratio of 1.23 or less. The GaAs single crystal substrates for Sample 4, Sample 7 to Sample 10, and Sample 12 to Sample 18 all had a third analytical value of 0.57 nm or less and a fourth analytical value of 1.37 or less. Furthermore, in the GaAs single crystal substrates for Sample 4, Sample 7 to Sample 10, and Sample 12 to Sample 18, the average value of the number of particles each having a major axis of 0.16 μm or more and present on the main surface per cm$^2$ was 1.6 or less. In this case, in the epitaxial substrates for the Sample 4, Sample 7 to Sample 10, and Sample 12 to Sample 14, the average value of the number of LPDs each having a major axis of 18 μm or more and present on the surfaces per cm$^2$ was 5 or less. Therefore, it was suggested that on the main surface of each of the GaAs single crystal substrates for Sample 4, Sample 7 to Sample 10, and Sample 12 to Sample 18, an epitaxial film in which the number of LPDs caused by both the oxide film and the particles is reduced can be formed on the entire surface thereof.

Although the embodiments and examples of the present disclosure have been described above, it is originally intended to combine the configurations of the embodiments and examples described above as desired.

It should be understood that the embodiments and examples disclosed herein are illustrative and non-restrictive in every respect. The scope of the present invention is defined by the terms of the claims rather than the embodiments and examples described above, and is intended to include any modifications within the scope and meaning equivalent to the terms of the claims.

REFERENCE SIGNS LIST

1 GaAs single crystal substrate; 1m main surface; 10 X-ray generator; 11 X-ray source; 12, 14 slit; 13 grating; 20 vacuum vessel; 30 electron spectrometer; 50 notch; 100 analysis system; LA As3*d* spectrum; LG Ga3*d* spectrum; L1 Ga$^{3+}$ spectrum; L2 Ga$^+$ spectrum; L3 Ga-As spectrum; L4 As$^{5+}$ spectrum; L5 As$^{3+}$ spectrum; L6 metallic As spectrum; L7 As-Ga spectrum; P1 to P5 measurement point; A1 to A5 measurement region; S100 preparation step; S200 cleaning step; S210 alkali cleaning step; S220 oxidation treatment step; S230 acid cleaning step; S231 second acid cleaning step; S240 drying step; S300 epitaxial film formation step; S310 thermal cleaning step; S320 epitaxial film growth step.

The invention claimed is:

1. A gallium arsenide single crystal substrate comprising a main surface having a circular shape,
wherein the gallium arsenide single crystal substrate has a first integrated intensity ratio or a second integrated intensity ratio,
the first integrated intensity ratio and the second integrated intensity ratio are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under a condition of an incident X-ray energy of 150 eV and a photoelectron take-off angle of 85°,
the first integrated intensity ratio is a ratio of a sum of an integrated intensity of gallium element present as digallium monoxide and an integrated intensity of gallium element present as digallium trioxide to an integrated intensity of gallium element present as gallium arsenide and is 12 or less,
the second integrated intensity ratio is a ratio of the sum of the integrated intensity of gallium element present as digallium monoxide and the integrated intensity of gallium element present as digallium trioxide to a sum of an integrated intensity of arsenic element present as diarsenic pentoxide and an integrated intensity of arsenic element present as diarsenic trioxide and is 1.2 or less, and the number of particles present on the main surface and each having a major axis of 0.16 μm or more is 2 or less per cm² of the main surface.

2. The gallium arsenide single crystal substrate according to claim 1, wherein the first integrated intensity ratio is 10.5 or less, and the second integrated intensity ratio is 1.05 or less.

3. The gallium arsenide single crystal substrate according to claim 1, wherein the gallium arsenide single crystal substrate has a diameter of 75 mm or more, the gallium arsenide single crystal substrate has a third integrated intensity ratio or a fourth integrated intensity ratio, the third integrated intensity ratio and the fourth integrated intensity ratio are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which five measurement points on the main surface are irradiated with X-rays under the condition, the third integrated intensity ratio is an average value of the ratio of the sum of the integrated intensity of gallium element present as the digallium monoxide and the integrated intensity of gallium element present as the digallium trioxide to the integrated intensity of gallium element present as the gallium arsenide and is 13.7 or less, the fourth integrated intensity ratio is an average value of the ratio of the sum of the integrated intensity of gallium element present as the digallium monoxide and the integrated intensity of gallium element present as the digallium trioxide to the sum of the integrated intensity of arsenic element present as the diarsenic pentoxide and the integrated intensity of arsenic element present as the diarsenic trioxide and is 1.23 or less, an average value of the number of particles measured at the five measurement points and each having a major axis of 0.16 μm or more is 1.6 or less per cm² of the main surface, and when the diameter of the gallium arsenide single crystal substrate is represented by D and two axes passing through the center of the main surface and being orthogonal to each other on the main surface are defined as an X-axis and a Y-axis, coordinates (X, Y) of the five measurement points on the X-axis and the Y-axis are (0, 0), (D/2−15, 0), (0, D/2−15), (−(D/2−15), 0), and (0, −(D/2−15)), and the D, and X and Y in the coordinates (X, Y) are expressed in units of mm.

4. A gallium arsenide single crystal substrate comprising a main surface having a circular shape, wherein the gallium arsenide single crystal substrate has a first analytical value or a second analytical value, the first analytical value and the second analytical value are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which a center of the main surface is irradiated with X-rays under each of the following five different conditions and subjecting the spectrum to a maximum smoothness method which is a mathematical analysis method, the first analytical value is a value representing a content of gallium oxides present as digallium monoxide and digallium trioxide in a region from the main surface of the gallium arsenide single crystal substrate to a depth of 2 nm and is 0.6 nm or less, the second analytical value is a value representing a ratio of the content of the gallium oxides to a content of arsenic oxides present as diarsenic pentoxide and diarsenic trioxide in the region from the main surface of the gallium arsenide single crystal substrate to a depth of 2 nm and is 1.4 or less, the number of particles present on the main surface and each having a major axis of 0.16 μm or more is 2 or less per cm² of the main surface, and the five different conditions are the following condition 1, condition 2, condition 3, condition 4, and condition 5, Condition 1: incident X-ray energy of 150 eV, and photoelectron take-off angle of 30°

Condition 2: incident X-ray energy of 150 eV, and photoelectron take-off angle of 45°

Condition 3: incident X-ray energy of 150 eV, and photoelectron take-off angle of 85°

Condition 4: incident X-ray energy of 600 eV, and photoelectron take-off angle of 45°

Condition 5: incident X-ray energy of 600 eV, and photoelectron take-off angle of 85°.

5. The gallium arsenide single crystal substrate according to claim 4, wherein the first analytical value is 0.48 nm or less, and the second analytical value is 1.2 or less.

6. The gallium arsenide single crystal substrate according to claim 4, wherein the gallium arsenide single crystal substrate has a diameter of 75 mm or more, the gallium arsenide single crystal substrate has a third analytical value or a fourth analytical value, the third analytical value and the fourth analytical value are each obtained by determining a spectrum of a detected intensity of a 3d electron of each of arsenic and gallium with respect to binding energy of a photoelectron emitted to an outside of the gallium arsenide single crystal substrate based on X-ray photoelectron spectroscopy in which five measurement points on the main surface are irradiated with X-rays under each of the five different conditions, and subjecting the spectrum to the maximum smoothness method, the third analytical value is a value representing an average value of the content of the gallium oxides present as the digallium monoxide and the digallium trioxide in the region from the main surface of the gallium arsenide single crystal substrate to the depth of 2 nm and is 0.57 nm or less, the fourth analytical value is a value representing an average value of the ratio of the content of the gallium oxides to the content of the arsenic oxides present as the diarsenic pentoxide and the diarsenic trioxide in the region from the main surface of the gallium arsenide single crystal substrate to a depth of 2 nm and is 1.37 or less, an average value of the number of particles measured at the five measurement points and each having a major axis of 0.16 μm or more is 1.6 or less per cm$^2$ of the main surface, and when the diameter of the gallium arsenide single crystal substrate is represented by D and two axes passing through the center of the main surface and being orthogonal to each other on the main surface are defined as an X-axis and a Y-axis, coordinates (X, Y) of the five measurement points on the X-axis and the Y-axis are (0, 0), (D/2−15, 0), (0, D/2−15), (−(D/2−15), 0), and (0, −(D/2−15)), and the D, and X and Y in the coordinates (X, Y) are expressed in units of mm.

7. The gallium arsenide single crystal substrate according to claim 1, wherein the gallium arsenide single crystal substrate has a diameter of 75 mm to 205 mm.

8. A method of manufacturing the gallium arsenide single crystal substrate having a main surface having a circular shape according to claim 1, the method comprising: preparing a gallium arsenide single crystal substrate precursor having a surface having a circular shape; and cleaning for obtaining the gallium arsenide single crystal substrate from the gallium arsenide single crystal substrate precursor, wherein the cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface, the turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes, and an acid concentration in the acid cleaning liquid is 0.5% by mass or more and less than 2% by mass.

9. A method of manufacturing the gallium arsenide single crystal according to claim 1, the method comprising: preparing a gallium arsenide single crystal substrate precursor having a surface having a circular shape; and cleaning for obtaining the gallium arsenide single crystal substrate from the gallium arsenide single crystal substrate precursor, wherein the cleaning includes turning the surface of the gallium arsenide single crystal substrate precursor into an alkali-cleaned surface by cleaning the surface with an alkali cleaning liquid, turning the alkali-cleaned surface into an acid-cleaned surface by cleaning the alkali-cleaned surface with an acid cleaning liquid, and obtaining the main surface by drying the acid-cleaned surface, the acid cleaning liquid contains both or one of an alcohol and a surfactant, an acid concentration in the acid cleaning liquid is 2% by mass to 5% by mass, an acid contained in the acid cleaning liquid is hydrochloric acid, hydrofluoric acid, or nitric acid, the alcohol is isopropyl alcohol or ethanol, and the surfactant is an anionic surfactant.

10. A method of manufacturing the gallium arsenide single crystal substrate according to claim 1, the method comprising: preparing a gallium arsenide single crystal substrate precursor having a surface having a circular shape; and cleaning for obtaining the gallium arsenide single crystal substrate from the gallium arsenide single crystal substrate precursor, wherein the cleaning includes turning the surface of the gallium arsenide single crystal substrate precursor into an alkali-cleaned surface by cleaning the surface with an alkali cleaning liquid, turning the alkali-cleaned surface into an oxidized surface by subjecting the alkali-cleaned surface to oxidation treatment, turning the oxidized surface into an acid-cleaned surface by cleaning the oxidized surface with an acid cleaning liquid, and obtaining the main surface by drying the acid-cleaned surface, the turning the alkali-cleaned surface into the oxidized surface includes immersing the gallium arsenide single crystal substrate precursor in a liquid of both or one of an aqueous hydrogen peroxide solution and ozone water at a temperature equal to or higher than room temperature for 1 minute to 20 minutes, the acid cleaning liquid contains both or one of an alcohol and a surfactant, an acid concentration in the acid cleaning liquid is 2% by mass to 5% by mass, an acid contained in the acid cleaning liquid is hydrochloric acid, hydrofluoric acid, or nitric acid, the alcohol is isopropyl alcohol or ethanol, and the surfactant is an anionic surfactant.

* * * * *